(12) United States Patent
Murayama et al.

(10) Patent No.: US 11,423,997 B2
(45) Date of Patent: Aug. 23, 2022

(54) SEMICONDUCTOR MEMORY DEVICE

(71) Applicant: Kioxia Corporation, Tokyo (JP)

(72) Inventors: Akiyuki Murayama, Koto Tokyo (JP); Kikuko Sugimae, Yokohama Kanagawa (JP); Katsuya Nishiyama, Yokohama Kanagawa (JP); Motohiko Fujimatsu, Yokohama Kanagawa (JP); Noboru Shibata, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/201,332

(22) Filed: Mar. 15, 2021

(65) Prior Publication Data

US 2022/0084609 A1    Mar. 17, 2022

(30) Foreign Application Priority Data

Sep. 17, 2020   (JP) .............................. JP2020-156406

(51) Int. Cl.
| | | |
|---|---|---|
| *G11C 11/34* | (2006.01) | |
| *G11C 16/34* | (2006.01) | |
| *G11C 16/10* | (2006.01) | |
| *G11C 16/26* | (2006.01) | |
| *G11C 16/04* | (2006.01) | |
| *G11C 16/08* | (2006.01) | |
| *G11C 16/24* | (2006.01) | |
| *G11C 16/30* | (2006.01) | |

(52) U.S. Cl.
CPC ...... *G11C 16/3459* (2013.01); *G11C 16/0425* (2013.01); *G11C 16/08* (2013.01); *G11C 16/10* (2013.01); *G11C 16/24* (2013.01); *G11C 16/26* (2013.01); *G11C 16/30* (2013.01)

(58) Field of Classification Search
CPC ......... G11C 16/10; G11C 16/30; G11C 16/12; G11C 16/0483
USPC ....................................... 365/185.18, 189.16
See application file for complete search history.

(56) References Cited

U.S. PATENT DOCUMENTS

| | | | |
|---|---|---|---|
| 8,902,668 B1 | 12/2014 | Dutta | |
| 10,014,064 B2 | 7/2018 | Kamata | |
| 10,210,924 B2 | 2/2019 | Kamata | |
| 10,541,033 B2* | 1/2020 | Jung ................. | G11C 16/3427 |

(Continued)

FOREIGN PATENT DOCUMENTS

| | | |
|---|---|---|
| JP | 2017-157260 A | 9/2017 |
| JP | 2018-120648 A | 8/2018 |

*Primary Examiner* — Son T Dinh
(74) *Attorney, Agent, or Firm* — Foley & Lardner LLP

(57) ABSTRACT

A semiconductor memory device includes first and second memory string including first and second memory cell, respectively, and first and second bit line connected to first and second memory string, respectively. In a first program operation, a first bit line voltage is supplied to the first and the second bit line. In a second program operation, a second bit line voltage larger than the first bit line voltage or a third bit line voltage larger than the second bit line voltage is supplied to the first and the second bit line. In a third program operation, the second and the third bit line voltage is supplied to the first and the second bit line, respectively. In a fourth program operation, the third and the second bit line voltage is supplied to the first and the second bit line, respectively.

18 Claims, 30 Drawing Sheets

(56) References Cited

U.S. PATENT DOCUMENTS 10,706,931 B2 7/2020 Maejima
2020/0211663 A1* 7/2020 Baraskar ............ G11C 16/3459

* cited by examiner

FIG. 18

| Bit | Loop k | | | Loop k+1 | | | Loop k+2 | Loop k+3 |
|---|---|---|---|---|---|---|---|---|
|  | Prog | VL | VH | Prog | VL | VH | Prog | Prog |
| α-1 | Pr | Pass | Pass | TI | Pass | Pass | PI | PI |
| α-2 | Pr | Pass | Pass | TI | Pass | Fail | Q2 | PI |
| α-3 | Pr | Pass | Pass | TI | Fail | Fail | TI | Q3 |
| β-1 | Pr | Pass | Fail | TI | Pass | Pass | Q2 | PI |
| β-2 | Pr | Pass | Fail | TI | Pass | Fail | Q2 | PI |
| β-3 | Pr | Pass | Fail | TI | Fail | Fail | TI | Q3 |
| γ | Pr | Fail | Fail | Pr | Fail | Fail | Pr | Pr |

Pr: Program
Q2: QPW @ Loop k+2
Q3: QPW @ Loop k+3
TI: Temporal Inhibit
PI: Permanent Inhibit

FIG. 21

| Bit | Loop k | | | Loop k+1 | | | Loop k+2 | Loop k+3 |
|---|---|---|---|---|---|---|---|---|
| | Prog | VL | VH | Prog | VL | VH | Prog | Prog |
| α-1 | Pr | Pass | Pass | Q1 | Pass | Pass | PI | PI |
| α-2 | Pr | Pass | Pass | Q1 | Pass | Fail | Q2 | PI |
| α-3 | Pr | Pass | Pass | Q1 | Fail | Fail | TI | Q3 |
| β-1 | Pr | Pass | Fail | Q1 | Pass | Pass | Q2 | PI |
| β-2 | Pr | Pass | Fail | Q1 | Pass | Fail | Q2 | PI |
| β-3 | Pr | Pass | Fail | Q1 | Fail | Fail | TI | Q3 |
| γ | Pr | Fail | Fail | Pr | Fail | Fail | Pr | Pr |

Pr: Program
Q1: QPW @ Loop k+1
Q2: QPW @ Loop k+2
Q3: QPW @ Loop k+3
TI: Temporal Inhibit
PI: Permanent Inhibit

FIG. 23

|  | Foggy | Fine |
|---|---|---|
| $PGm_p$ | $2m_p$ | $2m_p+2$ |
| $PGm_p-1$ | $2m_p-2$ | $2m_p+1$ |
| ⋮ | ⋮ | ⋮ |
| $PGn_p+1$ | $2n_p+2$ | $2n_p+5$ |
| $PGn_p$ | $2n_p$ | $2n_p+3$ |
| $PGn_p-1$ | $2n_p-2$ | $2n_p+1$ |
| ⋮ | ⋮ | ⋮ |
| PG2 | 4 | 7 |
| PG1 | 2 | 5 |
| PG0 | 1 | 3 |

…

SEMICONDUCTOR MEMORY DEVICE

CROSS-REFERENCE TO RELATED APPLICATIONS

This application is based upon and claims the benefit of Japanese Patent Application No. 2020-156406, filed on Sep. 17, 2020, the entire contents of which are incorporated herein by reference.

BACKGROUND

Field

Embodiments described herein relate generally to a semiconductor memory device.

Description of the Related Art

There has been known a semiconductor memory device including a plurality of memory strings including a memory transistor.

BRIEF DESCRIPTION OF THE DRAWINGS

FIG. 18 is a schematic view for describing the write sequence;

FIG. 21 is a schematic view for describing a write sequence according to the second embodiment;

FIG. 23 is a schematic table for describing a write sequence according to a third embodiment;

DETAILED DESCRIPTION

Figure 1:
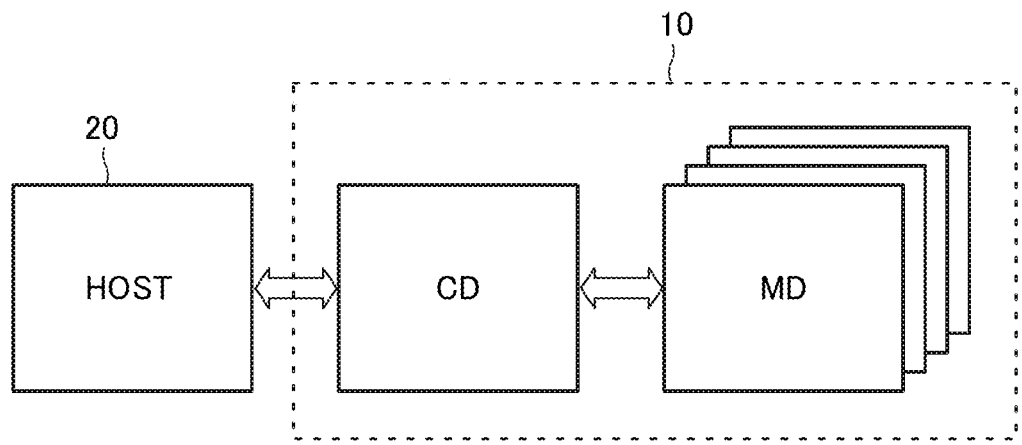
FIG. 1 is a schematic block diagram illustrating a configuration of a memory system 10 according to a first embodiment.

A semiconductor memory device according to one embodiment includes: a first memory string including a first memory cell; a second memory string including a second memory cell; a first bit line connected to the first memory string; a second bit line connected to the second memory string; a first word line connected to the first memory cell and the second memory cell; and a control circuit electrically connected to the first bit line, the second bit line, and the first word line. In a first write sequence on the first memory cell and the second memory cell, the control circuit: supplies a first bit line voltage to the first bit line and the second bit line in a first program operation; supplies a second bit line voltage larger than the first bit line voltage or a third bit line voltage larger than the second bit line voltage to the first bit line and the second bit line in a second program operation executed after the first program operation; supplies the second bit line voltage to the first bit line and supplies the third bit line voltage to the second bit line in a third program operation executed after the second program operation; and supplies the third bit line voltage to the first bit line and supplies the second bit line voltage to the second bit line in a fourth program operation executed after the third program operation.

A semiconductor memory device according to one embodiment includes: a first memory string including a first memory cell; a second memory string including a second memory cell; a first bit line connected to the first memory string; a second bit line connected to the second memory string; a first word line connected to the first memory cell and the second memory cell; a first voltage supply line electrically connected to the first bit line and the second bit line; a second voltage supply line electrically connected to the first bit line and the second bit line; a first voltage transfer circuit that electrically conducts the first bit line with the first voltage supply line in response to an input of a first signal and electrically conducts the first bit line with the second voltage supply line in response to an input of a second signal; a second voltage transfer circuit that electrically conducts the second bit line with the first voltage supply line in response to an input of a third signal and electrically conducts the second bit line with second voltage supply line in response to an input of a fourth signal; and a control circuit electrically connected to the first voltage supply line, the second voltage supply line, the first voltage transfer circuit, the second voltage transfer circuit, and the first word line. In a first write sequence on the first memory cell and the second memory cell, the control circuit: in a first program operation, supplies the first signal to the first voltage transfer circuit; and supplies the third signal to the second voltage transfer circuit, in a second program operation executed after the first program operation, supplies the second signal to the first voltage transfer circuit; and supplies the fourth signal to the second voltage transfer circuit. In a third program operation executed after the second program operation, and in a state where: the control circuit supplies the first signal to the first voltage transfer circuit; and the control circuit supplies the fourth signal to the second voltage transfer circuit, the control circuit switches a signal supplied to the first voltage transfer circuit from the first signal to the second signal. Ina fourth program operation executed after the third program operation, and in a state where: the control circuit supplies the second signal to the first voltage transfer circuit; and the control circuit supplies the third signal to the second voltage transfer circuit, the control circuit switches a signal supplied to the second voltage transfer circuit from the third signal to the fourth signal.

Next, the semiconductor memory device according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to "semiconductor memory device," it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

A "control circuit" in this specification may mean a peripheral circuit, such as a sequencer, disposed in a memory die, may mean a controller die, a controller chip, or the like connected to a memory die, and may mean a configuration including both of them.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may correspond to any of the X-direction, the Y-direction, and the Z-direction and need not to correspond to these directions.

Expressions, such as "above" and "below," in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end of a certain configuration mean a surface and an end portion on a side opposite to the substrate of this configuration. A surface intersecting with the X-direction or the Y-direction is referred to as a side surface and the like.

First Embodiment

[Memory System 10]

FIG. 1 is a schematic block diagram illustrating a configuration of a memory system 10 according to a first embodiment.

The memory system 10, for example, reads, writes, and erases user data in response to a signal transmitted from a host computer 20. The memory system 10 is, for example, any system that can store the user data including a memory chip, a memory card, and an SSD. The memory system 10 includes a plurality of memory dies MD that store the user data and a controller die CD connected to the plurality of memory dies MD and the host computer 20. The controller die CD includes, for example, a processor, a RAM, and the like, and performs conversion between a logical address and a physical address, bit error detection/correction, a garbage collection (compaction), a wear leveling, and the like.

Figure 2:
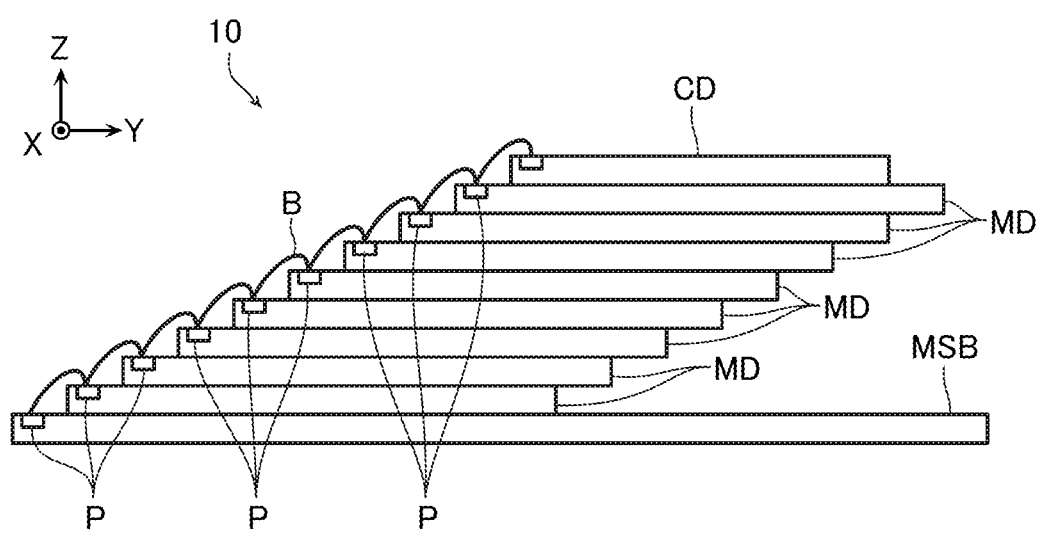
FIG. 2 is a schematic side view illustrating an exemplary configuration of the memory system 10.
Figure 3:
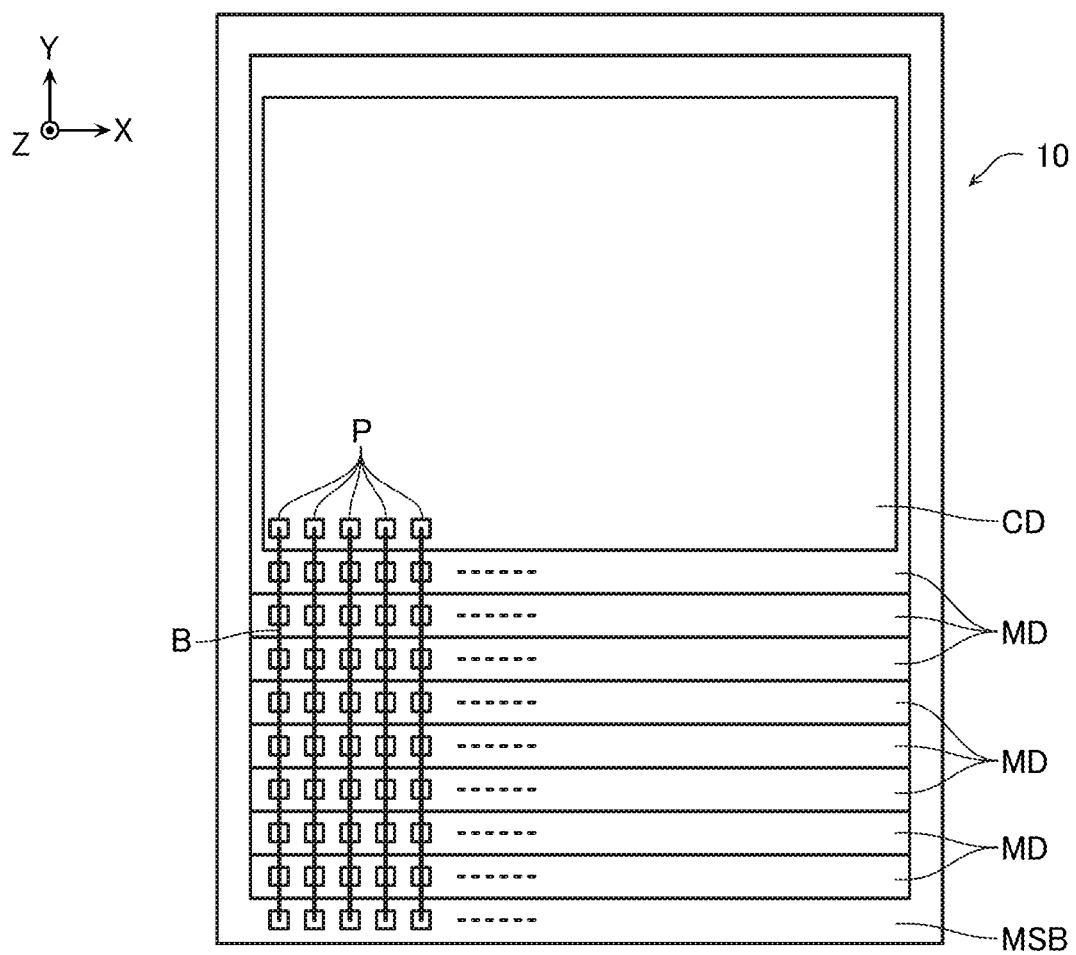
FIG. 3 is a schematic plan view illustrating the exemplary configuration.

FIG. 2 is a schematic side view illustrating an exemplary configuration of the memory system 10 according to the embodiment. FIG. 3 is a schematic plan view illustrating the exemplary configuration. For convenience of description, FIG. 2 and FIG. 3 omit a part of a configuration.

As illustrated in FIG. 2, the memory system 10 according to the embodiment includes a mounting substrate MSB, the plurality of memory dies MD stacked on the mounting substrate MSB, and the controller die CD stacked on the memory die MD. On an upper surface of the mounting substrate MSB, a pad electrode P is disposed in a region at an end portion in the Y-direction, and apart of the other region is bonded to a lower surface of the memory die MD via an adhesive and the like. On an upper surface of the memory die MD, the pad electrode P is disposed in a region at an end portion in the Y-direction, and the other region is bonded to a lower surface of another memory die MD or the controller die CD via the adhesive and the like. On an upper surface of the controller die CD, the pad electrode P is disposed in a region at an end portion in the Y-direction.

As illustrated in FIG. 3, the mounting substrate MSB, the plurality of memory dies MD, and the controller die CD each include a plurality of the pad electrodes P arranged in an X-direction. The plurality of pad electrodes P disposed to each of the mounting substrate MSB, the plurality of memory dies MD, and the controller die CD are mutually connected via bonding wires B.

Note that the configurations illustrated in FIG. 2 and FIG. 3 are merely examples, and specific configurations are appropriately adjustable. For example, in the example illustrated in FIG. 2 and FIG. 3, the controller die CD is stacked on the plurality of memory dies MD, and these configurations are connected with the bonding wires B. In such a configuration, the plurality of memory dies MD and the controller die CD are included in one package. However, the control die CD may be included in a package different from the memory die MD. Additionally, the plurality of memory dies MD and the controller die CD may be connected to one another via through electrodes or the like, not the bonding wires B.

[Circuit Configuration of Memory Die MD]

Figure 4:
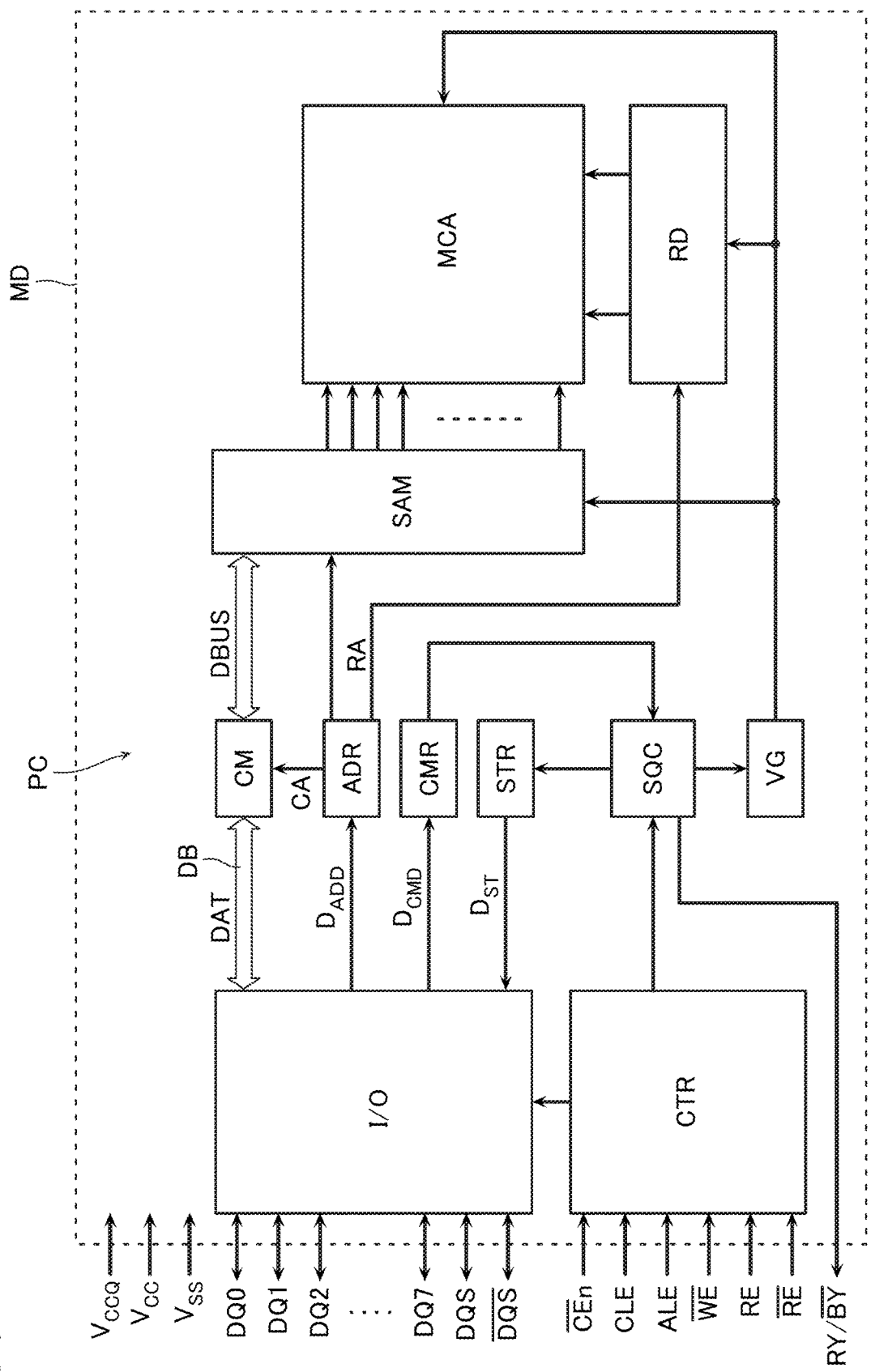
FIG. 4 is a schematic block diagram illustrating a configuration of a memory die MD according to the first embodiment.
Figure 5:
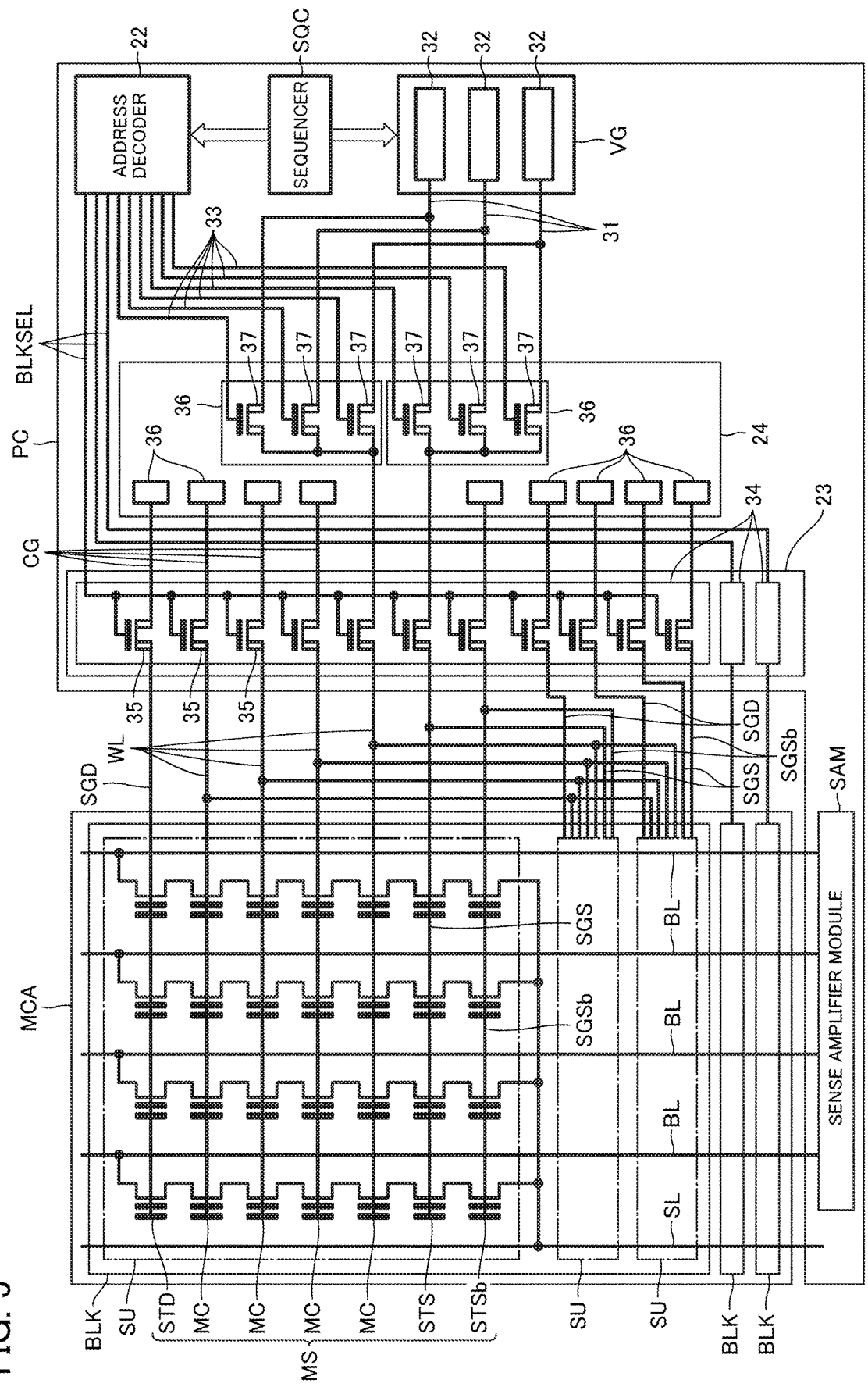
FIG. 5 is a schematic circuit diagram illustrating apart of the configuration of the memory die MD.
Figure 6:
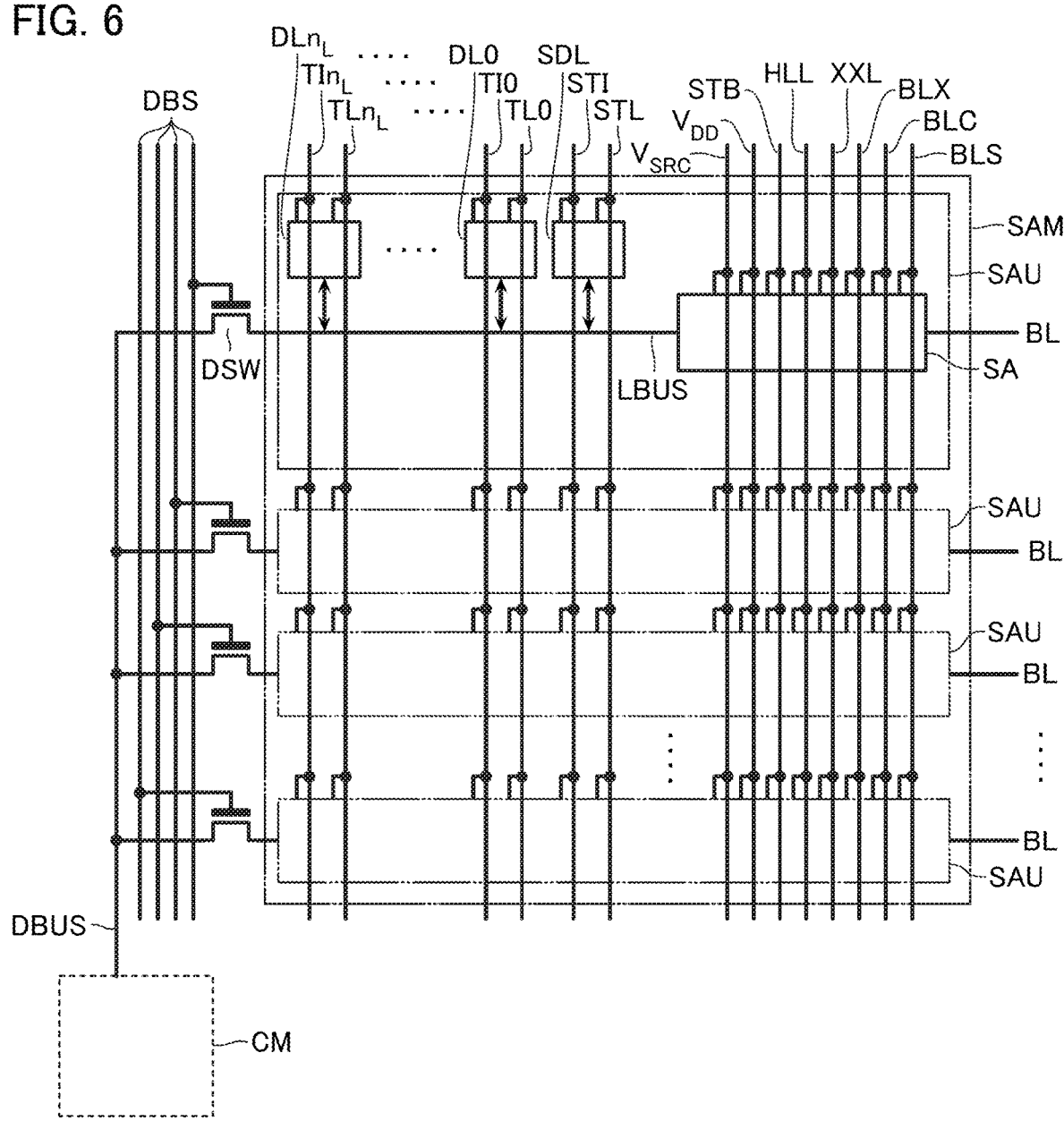
FIG. 6 is a schematic circuit diagram illustrating apart of the configuration of the memory die MD.
Figure 7:
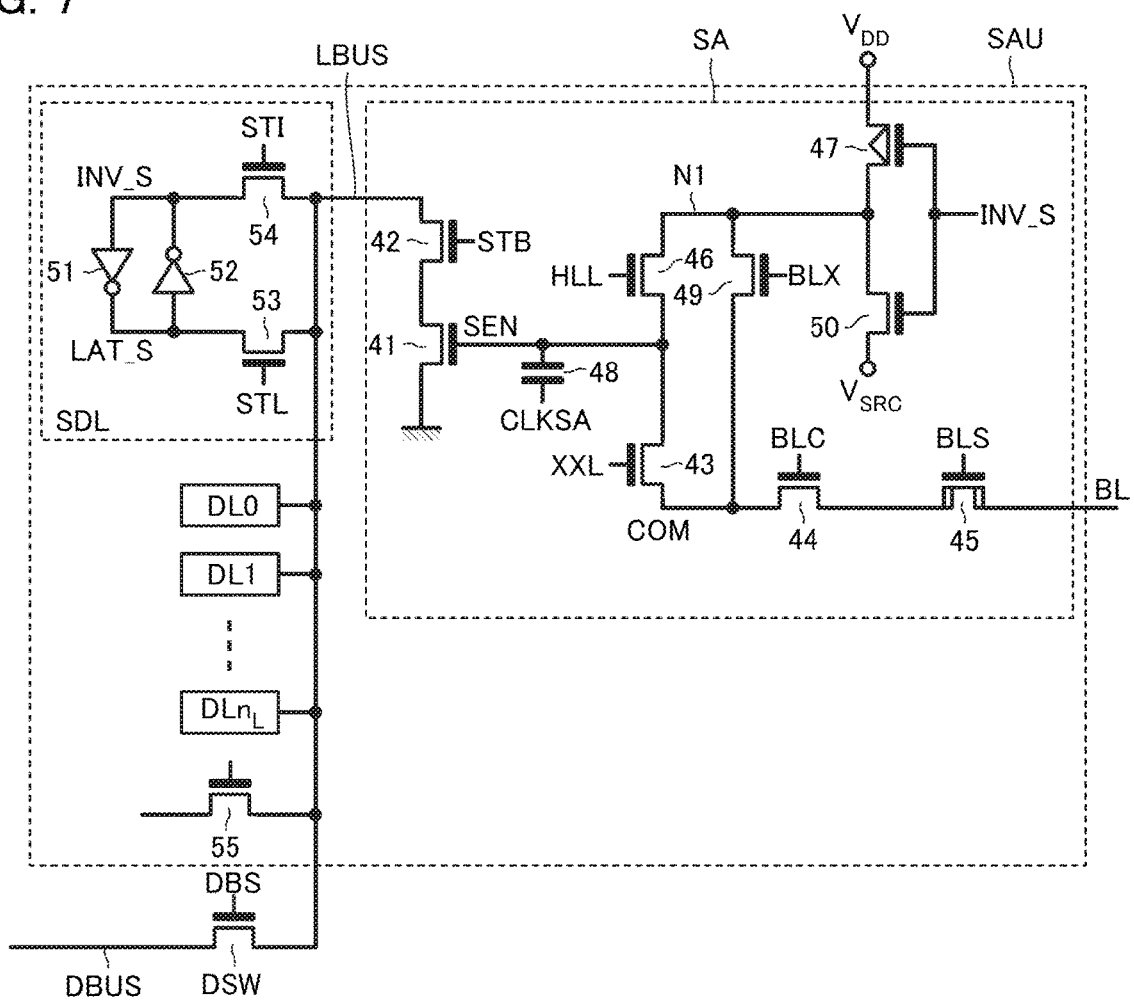
FIG. 7 is a schematic circuit diagram illustrating apart of the configuration of the memory die MD.

FIG. 4 is a schematic block diagram illustrating a configuration of the memory die MD according to the first embodiment. FIG. 5 to FIG. 7 are schematic circuit diagrams illustrating a configuration of a part of the memory die MD.

Note that FIG. 4 illustrates a plurality of control terminals and the like. The plurality of these control terminals may be expressed as control terminals corresponding to active-high signals (positive logic signals), may be expressed as control terminals corresponding to active-low signals (negative logic signals), or may be expressed as control terminals corresponding to both the active-high signals and the active-low signals. In FIG. 4, reference numerals of the control terminals corresponding to the active-low signals include an overline. In this specification, reference numerals of the control terminals corresponding to the active-low signals include a slash ("/"). Note that the illustration in FIG. 4 is an example, and the specific aspect is appropriately adjustable. For example, it is possible to change a part or all of the active-high signals to active-low signals or change a part or all of the active-low signals to active-high signals.

As illustrated in FIG. 4, the memory die MD includes a memory cell array MCA that stores data and a peripheral circuit PC connected to the memory cell array MCA. The peripheral circuit PC includes a voltage generation circuit VG, a row decoder RD, a sense amplifier module SAM, and a sequencer SQC. The peripheral circuit PC includes a cache memory CM, an address register ADR, a command register CMR, and a status register STR. The peripheral circuit PC includes an input/output control circuit I/O and a logic circuit CTR.

[Circuit Configuration of Memory Cell Array MCA]

The memory cell array MCA includes a plurality of memory blocks BLK as illustrated in FIG. 5. The plurality of memory blocks BLK each include a plurality of string units SU. The plurality of string units SU each include a plurality of memory strings MS. The plurality of memory strings MS have one ends each connected to the peripheral circuit PC via a bit line BL. The plurality of memory strings MS have other ends each connected to the peripheral circuit PC via a common source line SL.

The memory string MS includes a drain-side select transistor STD, a plurality of memory cells MC (memory transistors), a source-side select transistor STS, and a source-side select transistor STSb, which are connected in series between the bit line BL and the source line SL. Hereinafter, the drain-side select transistor STD, the source-side select transistor STS, and the source-side select transistor STSb may be simply referred to as select transistors (STD, STS, STSb).

The memory cell MC is a field-effect type transistor including a semiconductor layer that functions as a channel region, a gate insulating film including an electric charge accumulating film, and a gate electrode. The memory cell MC has a threshold voltage that changes according to an electric charge amount in the electric charge accumulating film. The memory cell MC stores one bit or a plurality of bits of data. Word lines WL are connected to the plurality of respective memory cells MC corresponding to one memory string MS. These respective word lines WL function as gate electrodes of the memory cells MC included in all of the memory strings MS in one memory block BLK.

The select transistor (STD, STS, STSb) is a field-effect type transistor including a semiconductor layer that functions as a channel region, a gate insulating film, and a gate electrode. Select gate lines (SGD, SGS, SGSb) are connected to the respective gate electrodes of the select transistors (STD, STS, STSb). The drain side select gate line SGD is disposed corresponding to the string unit SU and functions as the gate electrode of the drain-side select transistor STD included in all of the memory strings MS in one string unit SU. The source side select gate line SGS functions as the gate electrode of the source-side select transistor STS included in all of the memory strings MS in the plurality of string units SU. The source side select gate line SGSb functions as the gate electrode of the source-side select transistor STSb included in all of the memory strings MS in the plurality of string units SU.

[Circuit Configuration of Voltage Generation Circuit VG]

For example, as illustrated in FIG. 5, the voltage generation circuit VG (FIG. 4) is connected to a plurality of voltage supply lines 31. The voltage generation circuit VG includes, for example, a step down circuit, such as a regulator, and a step up circuit, such as a charge pump circuit 32. These step down circuit and step up circuit are each connected to a voltage supply line to which a power supply voltage $V_{CC}$ and a ground voltage $V_{SS}$ (FIG. 4) are supplied. These voltage supply lines are connected to, for example, the pad electrodes P described with reference to FIG. 2 and FIG. 3. For example, the voltage generation circuit VG generates a plurality of operating voltages applied to the bit line BL, the source line SL, the word line WL, and the select gate line (SGD, SGS, SGSb) in a read operation, a write operation, and an erase operation on the memory cell array MCA, in accordance with a control signal from the sequencer SQC to simultaneously output the operating voltages to the plurality of voltage supply lines 31. The operating voltage output from the voltage supply line 31 is appropriately adjusted in accordance with the control signal from the sequencer SQC.

[Circuit Configuration of Row Decoder RD]

The row decoder RD (FIG. 4) includes, for example, as illustrated in FIG. 5, an address decoder 22 that decodes address data $D_{ADD}$ and a block select circuit 23 and a voltage select circuit 24 that transfer the operating voltage to the memory cell array MCA in response to an output signal from the address decoder 22.

The address decoder 22 includes a plurality of block select lines BLKSEL and a plurality of voltage select lines 33. For example, the address decoder 22 sequentially refers to a row address RA in the address register ADR (FIG. 4) in response to the control signal from the sequencer SQC, decodes this row address RA to cause predetermined block select transistor 35 and voltage select transistor 37 corresponding to the row address RA to be in a state of ON, and cause the block select transistors 35 and the voltage select transistors 37 other than the above to be in a state of OFF. For example, voltages of the predetermined block select line BLKSEL and voltage select line 33 are set to be in a state of "H" and voltages other than those are set to be in a state of "L." When a P-channel type transistor is used, not an N-channel type transistor, an inverse voltage is applied to these wirings.

In the illustrated example, in the address decoder 22, one block select line BLKSEL is disposed per memory block BLK. However, this configuration is appropriately changeable. For example, one block select line BLKSEL may be included in per two or more memory blocks BLK.

The block select circuit 23 includes a plurality of block selectors 34 corresponding to the memory blocks BLK. The plurality of block selectors 34 each include a plurality of the block select transistors 35 corresponding to the word lines WL and the select gate lines (SGD, SGS, SGSb). The block select transistor 35 is, for example, a field-effect type high voltage transistor. The block select transistors 35 have drain electrodes each electrically connected to the corresponding word line WL or select gate line (SGD, SGS, SGSb). Source electrodes are each electrically connected to the voltage supply line 31 via a wiring CG and the voltage select circuit 24. The gate electrodes are commonly connected to the corresponding block select line BLKSEL.

Note that the block select circuit 23 further includes a plurality of transistors (not illustrated). The plurality of transistors are field-effect type high voltage transistors connected between the select gate lines (SGD, SGS, SGSb) and the voltage supply lines to which the ground voltage $V_{SS}$ is supplied. The plurality of transistors supply the select gate lines (SGD, SGS, SGSb) included in the non-selected memory blocks BLK with the ground voltage $V_{SS}$. Note that the plurality of word lines WL included in the non-selected memory blocks BLK enter a floating state.

The voltage select circuit 24 includes a plurality of voltage selectors 36 corresponding to the word lines WL and the select gate lines (SGD, SGS, SGSb). The plurality of voltage selectors 36 each include a plurality of the voltage select transistors 37. The voltage select transistor 37 is, for example, a field-effect type high voltage transistor. The voltage select transistors 37 have drain terminals each electrically connected to the corresponding word line WL or select gate line (SGD, SGS, SGSb) via the wiring CG and the block select circuit 23. The source terminals are each electrically connected to the corresponding voltage supply line 31. The gate electrodes are each connected to the corresponding voltage select line 33.

Note that the illustrated example shows the example where the wiring CG is connected to the voltage supply line 31 via one voltage select transistor 37. However, such a configuration is merely an example, and a specific configuration is appropriately adjustable. For example, the wiring CG may be connected to the voltage supply line 31 via two or more voltage select transistors 37.

[Circuit Configuration of Sense Amplifier Module SAM]

The sense amplifier module SAM (FIG. 4) includes a plurality of sense amplifier units SAU corresponding to the plurality of bit lines BL, for example, as illustrated in FIG. 6. The sense amplifier units SAU each include a sense amplifier SA connected to the bit line BL, a wiring LBUS connected to the sense amplifier SA, latch circuits SDL, DL0 to DLn$_L$ (n$_L$ is a natural number) connected to the wiring LBUS, and a charge transistor 55 (FIG. 7) for precharging connected to the wiring LBUS. The wiring LBUS in the sense amplifier unit SAU is connected to a wiring DBUS via a switch transistor DSW.

As illustrated in FIG. 7, the sense amplifier SA includes a sense transistor 41 that discharges an electric charge of the wiring LBUS in accordance with a current flown in the bit line BL. A source electrode of the sense transistor 41 is connected to the voltage supply line to which the ground voltage $V_{SS}$ is supplied. A drain electrode is connected to the wiring LBUS via a switch transistor 42. A gate electrode is connected to the bit line BL via a sense node SEN, a discharge transistor 43, a node COM, a clamp transistor 44, and a high voltage transistor 45. Note that the sense node SEN is connected an internal control signal line CLKSA via a capacitor 48.

The sense amplifier SA includes a voltage transfer circuit that selectively electrically conducts the node COM and the sense node SEN with a voltage supply line to which a voltage $V_{DD}$ is supplied or a voltage supply line to which a voltage $V_{SRC}$ is supplied in accordance with data latched by the latch circuit SDL. This voltage transfer circuit includes a node N1, a charge transistor 46 connected between the node N1 and the sense node SEN, a charge transistor 49 connected between the node N1 and the node COM, a charge transistor 47 connected between the node N1 and the voltage supply line to which the voltage $V_{DD}$ is supplied, and a discharge transistor 50 connected between the node N1 and the voltage supply line to which the voltage $V_{SRC}$ is supplied. Note that gate electrodes of the charge transistor 47 and the discharge transistor 50 are connected to anode INV_S of the latch circuit SDL in common.

Note that the sense transistor 41, the switch transistor 42, the discharge transistor 43, the clamp transistor 44, the charge transistor 46, the charge transistor 49, and the discharge transistor 50 are, for example, enhancement type NMOS transistors. The high voltage transistor 45 is, for example, a depletion type NMOS transistor. The charge transistor 47 is, for example, a PMOS transistor.

A gate electrode of the switch transistor 42 is connected to a signal line STB. A gate electrode of the discharge transistor 43 is connected to a signal line XXL. A gate electrode of the clamp transistor 44 is connected to a signal line BLC. A gate electrode of the high voltage transistor 45 is connected to a signal line BLS. A gate electrode of the charge transistor 46 is connected to a signal line HLL. A gate electrode of the charge transistor 49 is connected to a signal line BLX. These signal lines STB, XXL, BLC, BLS, HLL, and BLX are connected to the sequencer SQC.

The latch circuit SDL includes nodes LAT_S, INV_S, an inverter 51 including an output terminal connected to the node LAT_S and an input terminal connected to the node INV_S, an inverter 52 including an input terminal connected to the node LAT_S and an output terminal connected to the node INV_S, a switch transistor 53 connected to the node LAT_S and the wiring LBUS, and a switch transistor 54 connected to the node INV_S and the wiring LBUS. The switch transistors 53 and 54 are, for example, NMOS transistors. A gate electrode of the switch transistor 53 is connected to the sequencer SQC via a signal line STL. A gate electrode of the switch transistor 54 is connected to the sequencer SQC via a signal line STI.

The latch circuits DL0 to DLn$_L$ are configured approximately similarly to the latch circuit SDL. However, as described above, the node INV_S of the latch circuit SDL is electrically conducted with the gate electrodes of the charge transistor 47 and the discharge transistor 50 in the sense amplifier SA. The latch circuits DL0 to DLn$_L$ are different from the latch circuit SDL in this respect.

The switch transistor DSW is, for example, an NMOS transistor. The switch transistor DSW is connected between the wiring LBUS and the wiring DBUS. A gate electrode of the switch transistor DSW is connected to the sequencer SQC via a signal line DBS (FIG. 6).

Note that, as illustrated in FIG. 6, the above-described signal lines STB, HLL, XXL, BLX, BLC, and BLS are each connected between all the sense amplifier units SAU included in the sense amplifier module SAM in common. The voltage supply line to which the voltage V$_{DD}$ is supplied and the voltage supply line to which the voltage V$_{SRC}$ is supplied, described above, are also each connected between all the sense amplifier units SAU included in the sense amplifier module SAM in common. The signal line STI and the signal line STL of the latch circuit SDL are also each connected between all the sense amplifier units SAU included in the sense amplifier module SAM in common. Similarly, signal lines TI0 to TIn$_L$, TL0 to TLn$_L$ corresponding to the signal line STI and the signal line STL in the latch circuits DL0 to DLn$_L$ are each connected between all the sense amplifier units SAU included in the sense amplifier module SAM in common. On the other hand, a plurality of the signal lines DBS described above are disposed corresponding to all the respective sense amplifier units SAU included in the sense amplifier module SAM

[Circuit Configuration of Cache Memory CM]

The cache memory CM (FIG. 4) includes a plurality of latch circuits connected to the latch circuits DL0 to DLn$_L$ in the sense amplifier module SAM via the wiring DBUS. Data DAT included in the plurality of latch circuits is sequentially transferred to the sense amplifier module SAM or the input/output control circuit I/O.

To the cache memory CM, a decode circuit and a switch circuit (not illustrated) are connected. The decode circuit decodes a column address CA held in the address register ADR (FIG. 4). The switch circuit electrically conducts the latch circuit corresponding to the column address CA with a bus DB (FIG. 4) in response to an output signal from the decode circuit.

[Circuit Configuration of Sequencer SQC]

The sequencer SQC (FIG. 4) outputs an internal control signal to the row decoder RD, the sense amplifier module SAM, and the voltage generation circuit VG in response to command data D$_{CMD}$ held in the command register CMR. The sequencer SQC outputs status data D$_{ST}$ indicating its own state to the status register STR as necessary.

The sequencer SQC generates a ready/busy signal and outputs the ready/busy signal to a terminal RY//BY. In a period where the terminal RY//BY is in an "L" state (a busy period), an access to the memory die MD is basically inhibited. In a period where the terminal RY//BY in an "H" state (a ready period), the access to the memory die MD is permitted. The terminal RY//BY is achieved by, for example, the pad electrode P described with reference to FIG. 2 and FIG. 3.

[Circuit Configuration of Input/Output Control Circuit I/O]

The input/output control circuit I/O includes data signal input/output terminals DQ0 to DQ7, clock signal input/output terminals DQS, /DQS, an input circuit, such as a comparator, and an output circuit, such as an Off Chip Driver (OCD) circuit. The input circuit and the output circuit are connected to the data signal input/output terminals DQ0 to DQ7. The input/output control circuit I/O includes a shift register connected to the input circuit and the output circuit, and a buffer circuit. The input circuit, the output circuit, the shift register, and the buffer circuit are each connected to a terminal to which a power supply voltage V$_{CCQ}$ and the ground voltage V$_{SS}$ are supplied. The data signal input/output terminals DQ0 to DQ7, the clock signal input/output terminals DQS, /DQS, and the terminals to which the power supply voltage V$_{CCQ}$ is supplied are achieved by, for example, the pad electrodes P described with reference to FIG. 2 and FIG. 3. Data input via the data signal input/output terminals DQ0 to DQ7 are output from the buffer circuit to the cache memory CM, the address register ADR, or the command register CMR in response to an internal control signal from the logic circuit CTR. Data output via the data signal input/output terminals DQ0 to DQ7 are input to the buffer circuit from the cache memory CM or the status register STR in response to the internal control signal from the logic circuit CTR.

[Circuit Configuration of Logic Circuit CTR]

The logic circuit CTR (FIG. 4) receives an external control signal from the controller die CD via external control terminals /CEn, CLE, ALE, /WE, RE, /RE and outputs the internal control signal to the input/output control circuit I/O in response to the external control signal. The external control terminals /CEn, CLE, ALE, /WE, RE, /RE are achieved by, for example, the pad electrodes P described with reference to FIG. 2 and FIG. 3.

[Structure of Memory Die MD]

Figure 8:
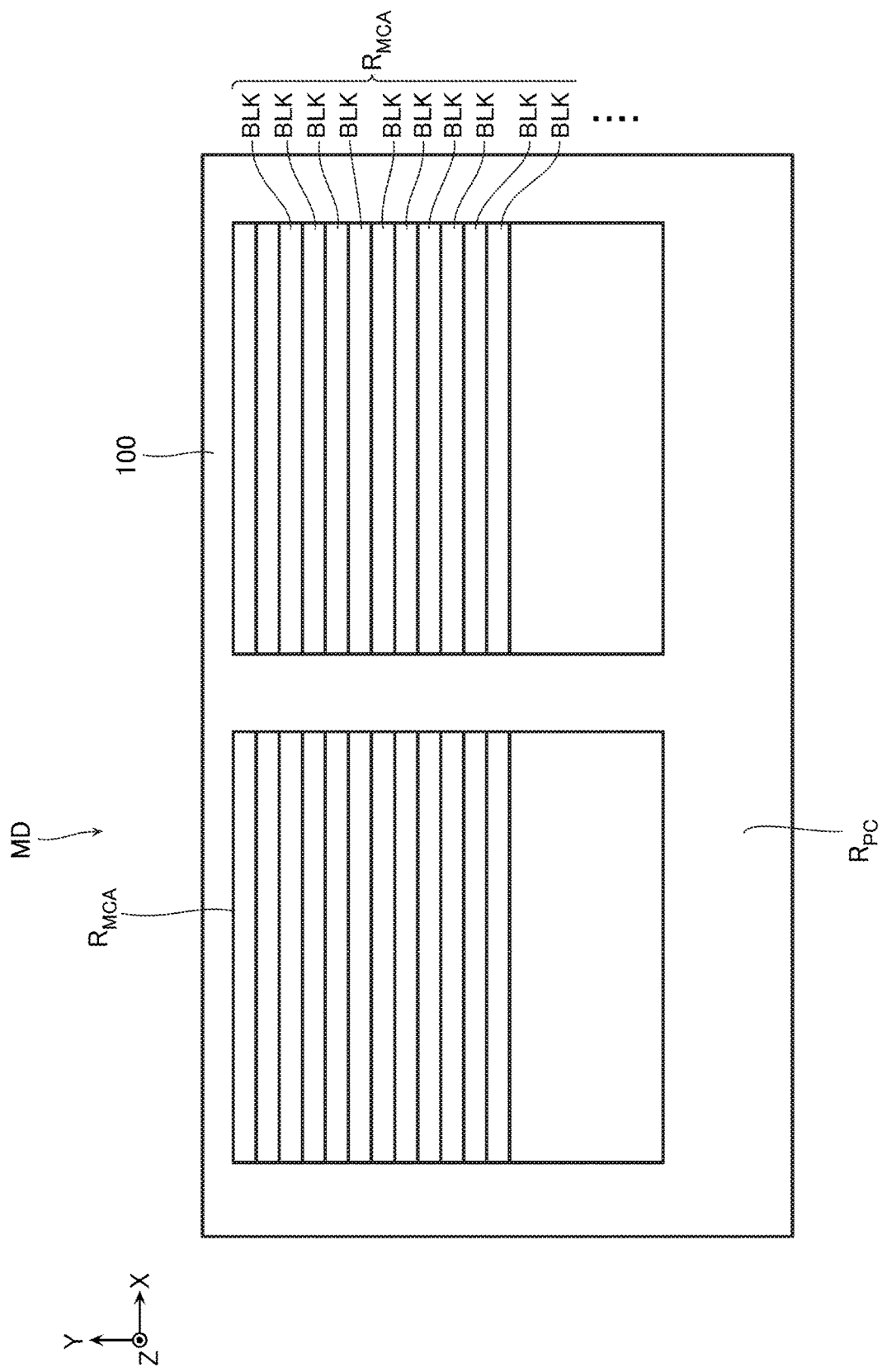
FIG. 8 is a schematic plan view of the memory die MD.
Figure 9:
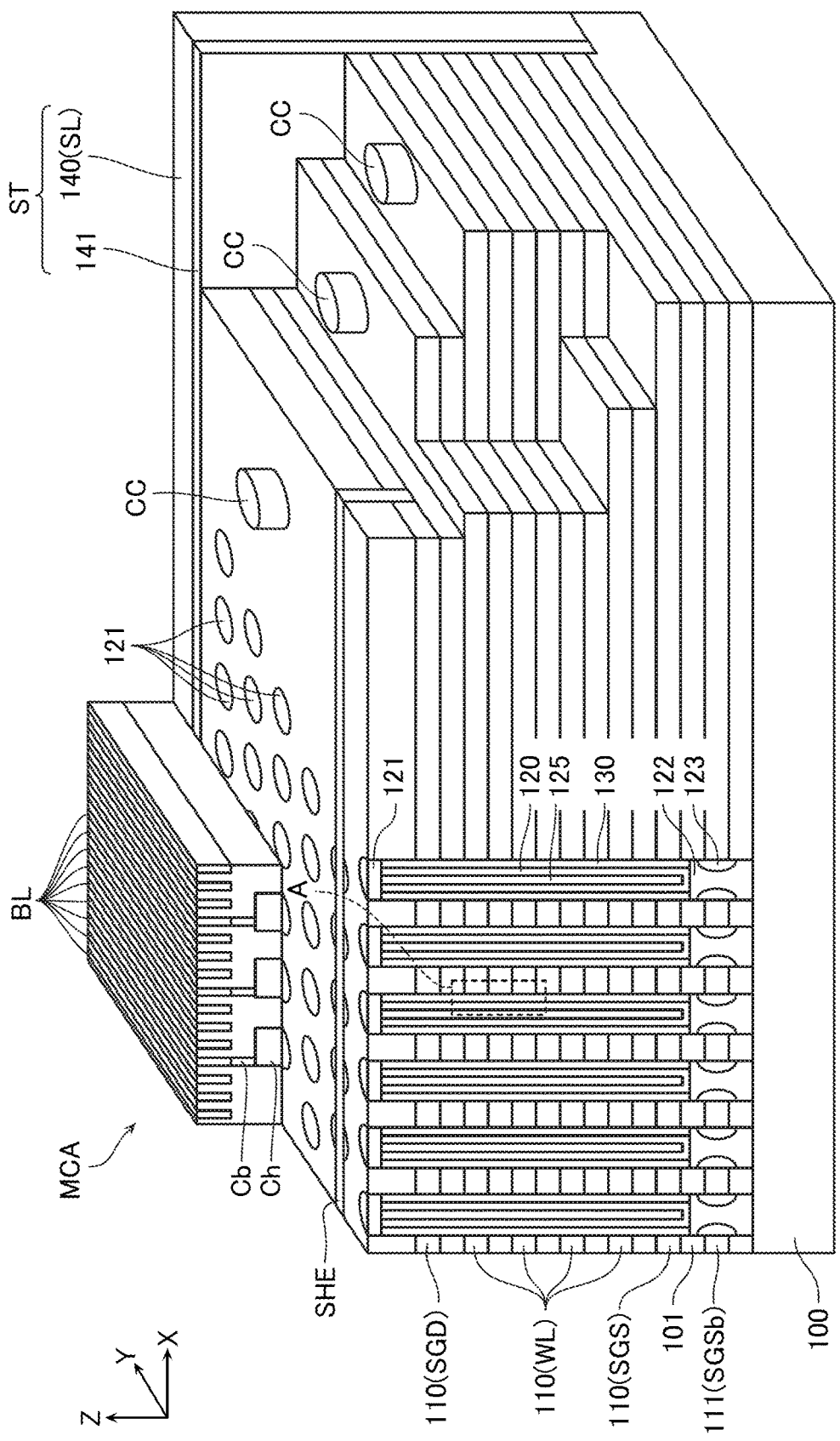
FIG. 9 is a schematic perspective view illustrating apart of the configuration of the memory die MD.
Figure 10:
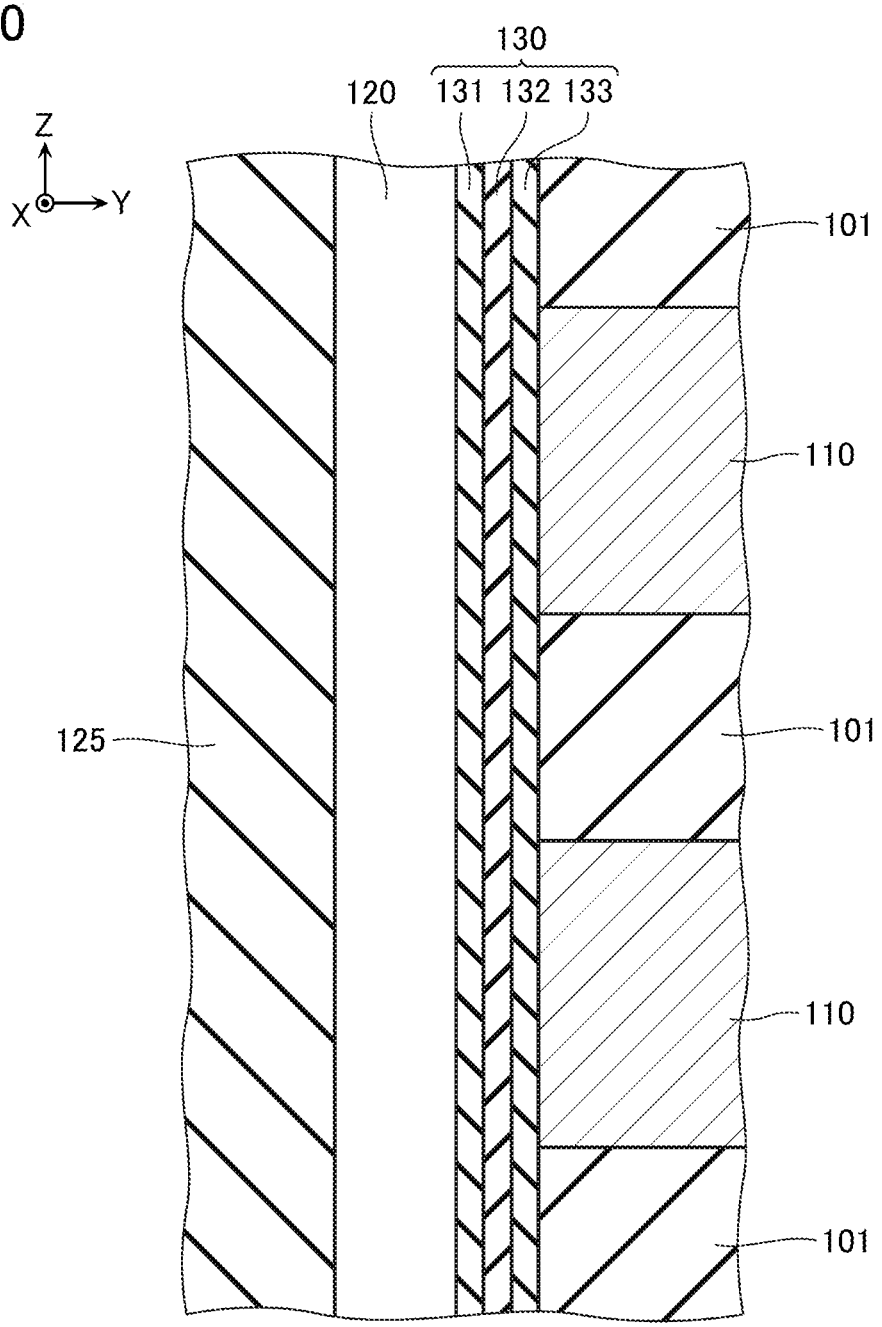
FIG. 10 is a schematic enlarged view of apart illustrated by A in FIG. 9.

FIG. 8 is a schematic plan view of the memory die MD. FIG. 9 is a schematic perspective view illustrating a part of the configuration of the memory die MD. FIG. 10 is a schematic enlarged view of a part indicated by A in FIG. 9.

As illustrated in FIG. 8, the memory die MD includes a semiconductor substrate 100. In the illustrated example, the semiconductor substrate 100 includes two memory cell array regions R$_{MCA}$ arranged in the X-direction. The memory cell array region R$_{MCA}$ includes the plurality of memory blocks BLK arranged in the Y-direction. Between two memory blocks BLK adjacent in the Y-direction, the inter-block structure ST (FIG. 9) is disposed. In a region outside these two memory cell array regions R$_{MCA}$, a peripheral circuit area R$_{PC}$ (FIG. 8) is disposed.

The semiconductor substrate 100 is, for example, a semiconductor substrate of P-type silicon (Si) containing P-type impurities, such as boron (B). For example, in the surface of the semiconductor substrate 100, an N-type well region containing N-type impurities, such as phosphorus (P), a P-type well region containing P-type impurities, such as boron (B), a semiconductor substrate region where the N-type well region or the P-type well region is not disposed, and insulating regions are disposed. The N-type well region, the P-type well region, and the semiconductor substrate region each function as a part of a plurality of the transistors, a plurality of capacitors, and the like constituting the peripheral circuit PC.

For example, as illustrated in FIG. 9, the memory block BLK includes a plurality of conductive layers 110 arranged in the Z direction, a plurality of semiconductor layers 120 extending in the Z direction, and a plurality of respective gate insulating films 130 disposed between the plurality of conductive layers 110 and the plurality of semiconductor layers 120.

The conductive layer 110 is a substantially plate-shaped conductive layer extending in the X-direction. The conductive layer 110 may include a stacked film of a barrier conductive film, such as titanium nitride (TiN), and a metal film, such as tungsten (W), or the like. For example, the conductive layer 110 may contain polycrystalline silicon containing impurities, such as phosphorus (P) or boron (B), or the like. Between the plurality of conductive layers 110 arranged in the Z direction, insulating layers 101, such as silicon oxide ($SiO_2$), are disposed.

A conductive layer 111 is disposed below the conductive layer 110. The conductive layer 111 may include, for example, a stacked film of a barrier conductive film, such as titanium nitride (TiN), and a metal film, such as tungsten (W), or the like. Between the conductive layer 111 and the conductive layer 110, the insulating layer 101, such as silicon oxide ($SiO_2$), is disposed.

The conductive layer 111 functions as the source side select gate line SGSb (FIG. 5) and gate electrodes of the plurality of source-side select transistors STSb connected to the source side select gate line SGSb. The conductive layers 111 are electrically independent in every memory block BLK.

Among the plurality of conductive layers 110, one or the plurality of conductive layers 110 positioned at the lowermost layer function as the source side select gate line SGS (FIG. 5) and gate electrodes of the plurality of source-side select transistors STS connected to the source side select gate line SGS.

The plurality of conductive layers 110 positioned upward of this layer function as the word lines WL (FIG. 5) and gate electrodes of the plurality of memory cells MC (FIG. 5) connected to the word lines WL. The plurality of respective conductive layers 110 are electrically connected to the plurality of conductive layers 110 adjacent in the X-direction. The plurality of conductive layers 110 are each electrically independent in every memory block BLK.

One or the plurality of conductive layers 110 positioned upward of these conductive layers 110 function as the drain side select gate line SGD and gate electrodes of the plurality of drain-side select transistors STD (FIG. 5) connected the drain side select gate line SGD. For example, as illustrated in FIG. 9, between the two conductive layers 110 adjacent in the Y-direction, the inter-string unit insulating layer SHE is disposed. The plurality of conductive layers 110 are each electrically independent in every string units SU.

Note that the plurality of conductive layers 110 have end portions in the X-direction where connecting portions with a plurality of contacts CC are disposed. The plurality of contacts CC extend in the Z-direction, and have lower ends connected to the conductive layers 110. The contacts CC may, for example, include a stacked film of a barrier conductive film, such as titanium nitride (TiN), and a metal film, such as tungsten (W), or the like.

The semiconductor layers 120 are arranged in the X-direction and the Y-direction in a predetermined pattern. The semiconductor layers 120 function as the channel regions of the plurality of memory cells MC and the select transistors (STD, STS, STSb) included in one memory string MS (FIG. 1). The semiconductor layer 120 is, for example, a semiconductor layer, such as polycrystalline silicon (Si). For example, the semiconductor layer 120 has a substantially closed-bottomed cylindrical shape and includes an insulating layer 125, such as silicon oxide, in the center part. The semiconductor layer 120 has an outer peripheral surface that is surrounded by each of the conductive layers 110, and is opposed to the conductive layers 110.

The semiconductor layer 120 has an upper end portion where impurity regions 121 containing N-type impurities, such as phosphorus (P), are disposed. The impurity regions 121 are connected to the bit lines BL extending in the Y-direction via contacts Ch and contacts Cb.

The semiconductor layer 120 has a lower end portion connected to a P-type well region of the semiconductor substrate 100 via a semiconductor layer 122 formed of single-crystal silicon (Si) and the like. The semiconductor layer 122 functions as a channel region of the source-side select transistor STSb. The semiconductor layer 122 has an outer peripheral surface that is surrounded by the conductive layer 111, and is opposed to the conductive layer 111. Between the semiconductor layer 122 and the conductive layer 111, an insulating layer 123, such as silicon oxide, is disposed.

The gate insulating film 130 has a substantially cylindrical shape that covers the outer peripheral surface of the semiconductor layer 120.

The gate insulating film 130 includes, for example, as illustrated in FIG. 10, a tunnel insulating film 131, an electric charge accumulating film 132, and a block insulating film 133, which are stacked between the semiconductor layer 120 and the conductive layers 110. The tunnel insulating film 131 and the block insulating film 133 are, for example, insulating films of silicon oxide ($SiO_2$) or the like. The electric charge accumulating film 132 is, for example, a film of silicon nitride ($Si_3N_4$) or the like that can accumulate an electric charge. The tunnel insulating film 131, the electric charge accumulating film 132, and the block insulating film 133, which have substantially cylindrical shapes, extend in the Z direction along the outer peripheral surface of the semiconductor layer 120.

FIG. 10 illustrates an example in which the gate insulating film 130 includes the electric charge accumulating film 132 of silicon nitride or the like. However, the gate insulating film 130 may include, for example, a floating gate of polycrystalline silicon containing N-type or P-type impurities or the like.

The inter-block structure ST includes a conductive layer 140 that extends in the Z-direction and the X-direction and an insulating layer 141 disposed on a side surface of the conductive layer 140, for example, as illustrated in FIG. 9. The conductive layer 140 is connected to an N-type impurity region disposed in the P-type well region of the semiconductor substrate 100. The conductive layer 140 may include, for example, a stacked film of a barrier conductive film, such as titanium nitride (TiN), and a metal film, such as tungsten (W), or the like. The conductive layer 140, for example, functions as a part of the source line SL (FIG. 5).

[Threshold Voltage of Memory Cell MC]

Next, the threshold voltage of the memory cell MC will be described with reference to FIG. 11.

As described above, the memory cell array MCA includes the plurality of memory cells MC. When a write sequence is performed to the plurality of memory cells MC, the threshold voltages of these memory cells MC are controlled in a plurality of patterns of states.

Figure 11:
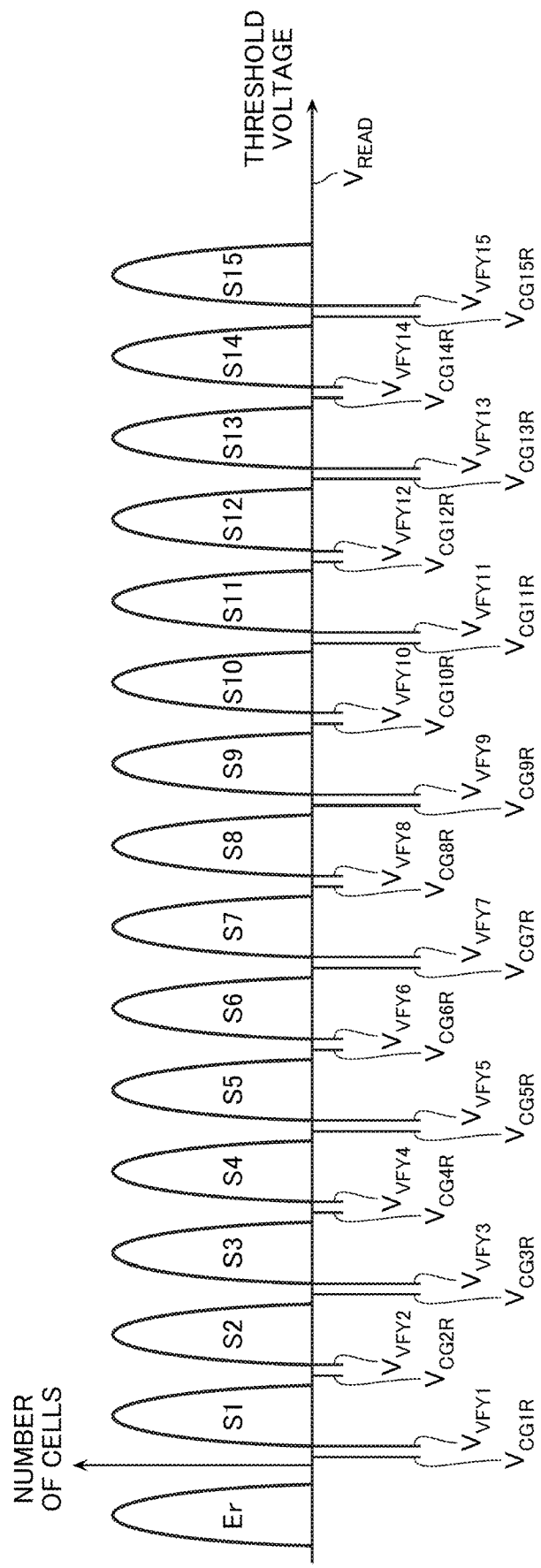
FIG. 11 is a schematic histogram for describing a threshold voltage of a memory cell MC.

FIG. 11 is a schematic histogram for describing a threshold voltage of the memory cell MC in which 4 bit data is recorded. The horizontal axis indicates a voltage of the word line WL, and the vertical axis indicates the number of the memory cells MC.

In the example in FIG. 11, the threshold voltage of the memory cell MC is controlled in sixteen patterns of states. For example, the threshold voltage of the memory cell MC controlled in a state S1 is larger than a read voltage $V_{CG1R}$ and a verify voltage $V_{VFY1}$ and smaller than a read voltage $V_{CG2R}$ and a verify voltage $V_{VFY2}$ in FIG. 11. The threshold voltages of all the memory cells MC are smaller than a read pass voltage $V_{READ}$ in FIG. 11.

For example, a state Er corresponds to a lowest threshold voltage (threshold voltage of the memory cell MC in an erased state). For example, data "1111" may be assigned to the memory cell MC corresponding to the state Er.

The state S1 corresponds to the threshold voltage greater than the threshold voltage corresponding to the state Er. For example, data "1011" may be assigned to the memory cell MC corresponding to the state S1.

A state S2 corresponds to the threshold voltage greater than the threshold voltage corresponding to the state S1. For example, data "0011" may be assigned to the memory cell MC corresponding to the state S2.

The same applies to the following, and a state S3 to a state S15 in the drawing correspond to the threshold voltages greater than the threshold voltages corresponding to the state S2 to a state S14. For example, 4 bit data other than the above-described "1111," "1011," or "0011," may be assigned to the memory cells MC corresponding to the distribution of them.

The number of bits of the data recorded in the memory cell MC, the number of states, the assignment of the data to each state, and the like are changeable as necessary.

For example, when every fourth bit in the state Er and the state S1 to a state S7 are assigned with "1," and every fourth bit in a state S8 to a state S15 are assigned with "0," a read voltage $V_{CG8R}$ is supplied to the word line WL upon reading the fourth bit data.

For example, when every third bit in the state Er and the state S1 to the state S3 are assigned with "1," every third bit in a state S4 to a state S11 are assigned with "0," and every third bit in a state S12 to the state S15 are assigned with "1," read voltages $V_{CG4R}$, $V_{CG12R}$ are supplied to the word line WL upon reading the third bit data.

[Read Operation]

Figure 12:
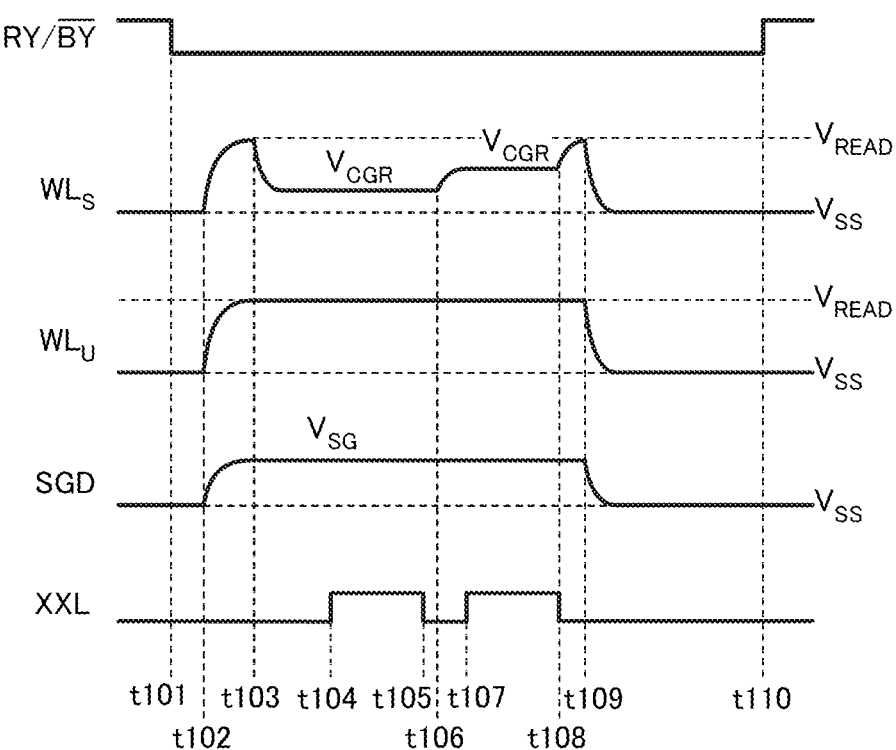
FIG. 12 is a schematic waveform diagram for describing a read operation.
Figure 13:
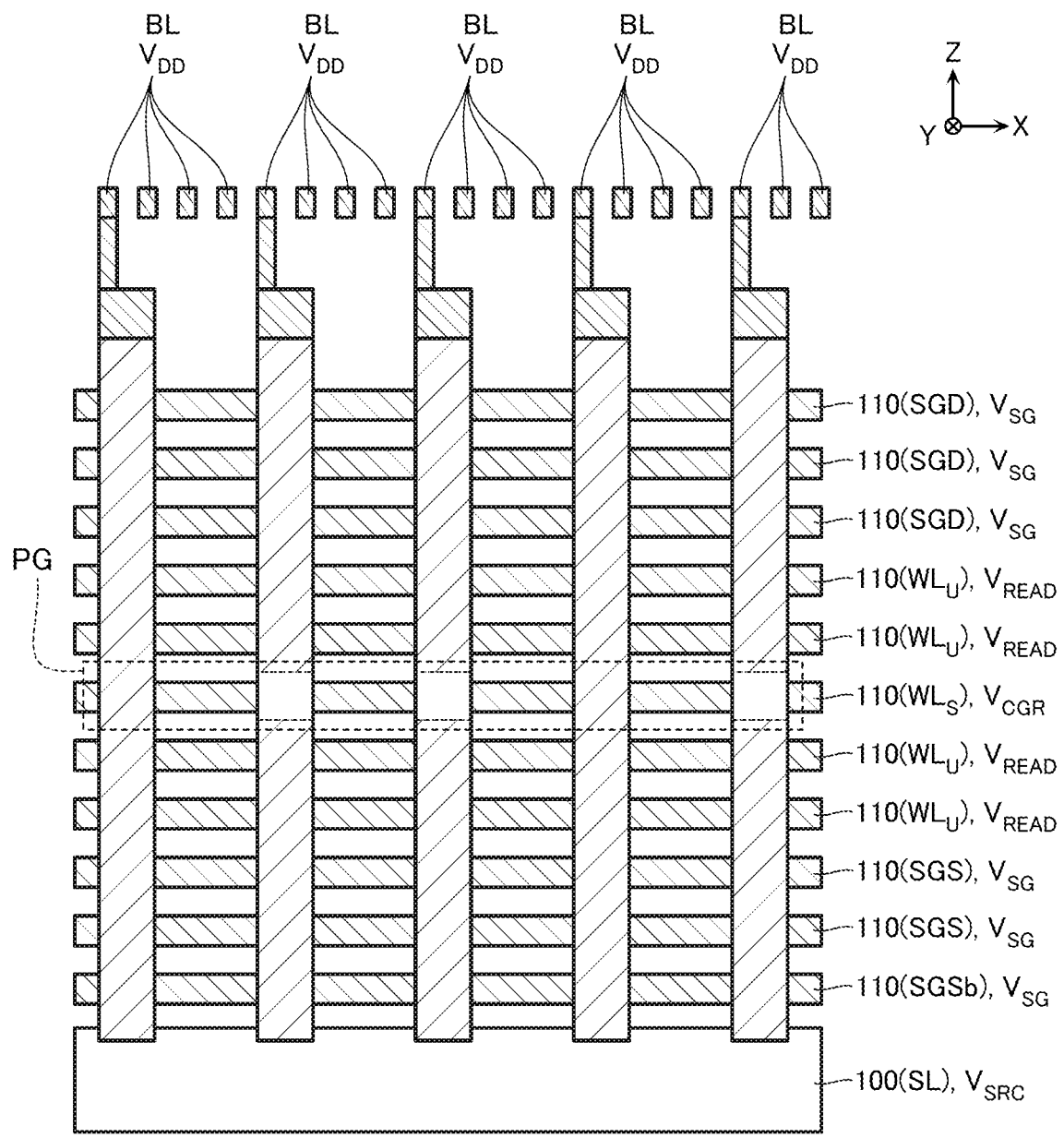
FIG. 13 is a schematic cross-sectional view for describing the read operation.

Next, a description will be given of the read operation of the semiconductor memory device according to the embodiment with reference to FIG. 12 and FIG. 13. FIG. 12 is a schematic waveform diagram for describing the read operation. FIG. 13 is a schematic cross-sectional view for describing the read operation.

Note that, in the following description, the word line WL as an object of operation may be referred to as a selected word line $WL_S$ and the other word line WL may be referred to as a non-selected word line $WL_U$. Also, the following description will describe an example where the read operation is executed on the memory cell MC connected to the selected word line $WL_S$ (hereinafter may be referred to as a "selected memory cell MC") among the plurality of memory cells MC included in the string unit SU as an object of operation. A configuration that belongs to one string unit SU and includes all the memory cells MC corresponding to the same word line WL may be referred to as a page PG.

Upon executing the read operation, a command set that causes the read operation to be executed is input from the controller die CD to the memory die MD. This command set includes command data $D_{CMD}$ that causes the read operation to be executed and address data $D_{ADD}$ that specifies the page PG the memory block BLK, the memory die MD, and the like, as an object of read operation.

At a timing t101 of the read operation, the terminal RY//BY (FIG. 4) enters into the "L" state. At the timing t101, for example, charging of the bit line BL is performed. For example, the latch circuit SDL in FIG. 7 is caused to latch "H," and the states of the signal lines STB, XXL, BLC, BLS, HLL, BLX are caused to be "L, L, H, H, H, H." This supplies the voltage $V_{DD}$ to the bit line BL and the sense node SEN to start their charging. For example, the source line SL (FIG. 5) is supplied with the voltage $V_{SRC}$ to start their charging. The voltage $V_{SRC}$, for example, has a magnitude approximately the same as the ground voltage $V_{SS}$. The voltage $V_{SRC}$ for example, is larger than the ground voltage $V_{SS}$, and smaller than the voltage $V_{DD}$.

At a timing t102 of the read operation, for example, as illustrated in FIG. 12, the selected word line $WL_S$ and non-selected word line $WL_U$ are supplied with the read pass voltage $V_{READ}$ to cause all the memory cells MC to be in the ON state. The select gate lines (SGD, SGS, SGSb) are supplied with a voltage $V_{SG}$ to cause the select transistors (STD, STS, STSb) to be in the ON state.

At a timing t103 of the read operation, the selected word line $WL_S$ is supplied with a read voltage $V_{CGR}$ (any of $V_{CG1R}$ to $V_{CG15R}$). This causes a part of the selected memory cells MC to be in the ON states and the rest of the selected memory cells MC to be in the OFF state, for example, as illustrated in FIG. 13.

At a timing t104 to a timing t105 of the read operation, for example, as illustrated in FIG. 12, the sense amplifier module SAM (FIG. 6) detects the ON state/OFF state of the selected memory cells MC. For example, the wiring LBUS is charged via the charge transistor 55 in FIG. 7. At the timing t104, the states of the signal lines STB, XXL, BLC, BLS, HLL, BLX are caused to be "L, H, H, H, L, H," and the electric charge of the sense node SEN is discharged to the bit lines BL. Here, the voltage of the sense node SEN connected to the bit line BL corresponding to the memory cell MC in the ON state relatively largely decreases. On the other hand, the voltage of the sense node SEN connected to the bit line BL corresponding to the memory cell MC in the OFF state does not significantly decrease. At the timing t105, the states of the signal lines STB, XXL, BLC, BLS, HLL, BLX are caused to "H, L, H, H, L, H," and the electric charge of the wiring LBUS is discharged or maintained. The signal line STL is caused to be in the "H" state, and any of the latch circuits DL0 to $DLn_L$ is caused to latch the data indicative of the state of the selected memory cell MC.

At a timing t106 to a timing t108 of the read operation, another read voltage $V_{CGR}$ (any of $V_{CG1R}$ to $V_{CG15R}$) is supplied to the selected word line $WL_S$, and the sense amplifier module SAM (FIG. 6) detects the ON state/OFF state of the selected memory cells MC to obtain the data indicative of the state of the selected memory cell MC. In this respect, the signal line XXL is caused to be in the "H" state at the timing t106 and the signal line XXL is caused to be in the "L" state at a timing t107.

At the timing t108 of the read operation, the read pass voltage $V_{READ}$ is supplied to the selected word line $WL_S$ and the non-selected word line $WL_U$ to cause all the memory cells MC to be in the ON state. The voltage $V_{SG}$ is supplied to the select gate lines (SGD, SGS, SGSb) to cause the select transistors (STD, STS, STSb) to be in the ON state.

At a timing t109 of the read operation, the ground voltage $V_{SS}$ is supplied to the selected word line $WL_S$, the non-selected word line $WL_U$, and the select gate lines (SGD, SGS, SGSb).

Afterwards, a logic operation and the like, such as AND and OR, is appropriately executed on the data latched by the latch circuits DL0 to $DLn_L$ to calculate the data recorded in the memory cells MC, and the data is transferred to the cache memory CM (FIG. 4).

Note that, in the example in FIG. 12, the example in which two patterns of read voltages $V_{CGR}$ are supplied to the selected word line $WL_S$ in the read operation is illustrated. However, the number of the read voltages $V_{CGR}$ supplied to the selected word line $WL_S$ in the read operation may be one pattern or may be three or more patterns.

[Write Sequence]

Figure 14:
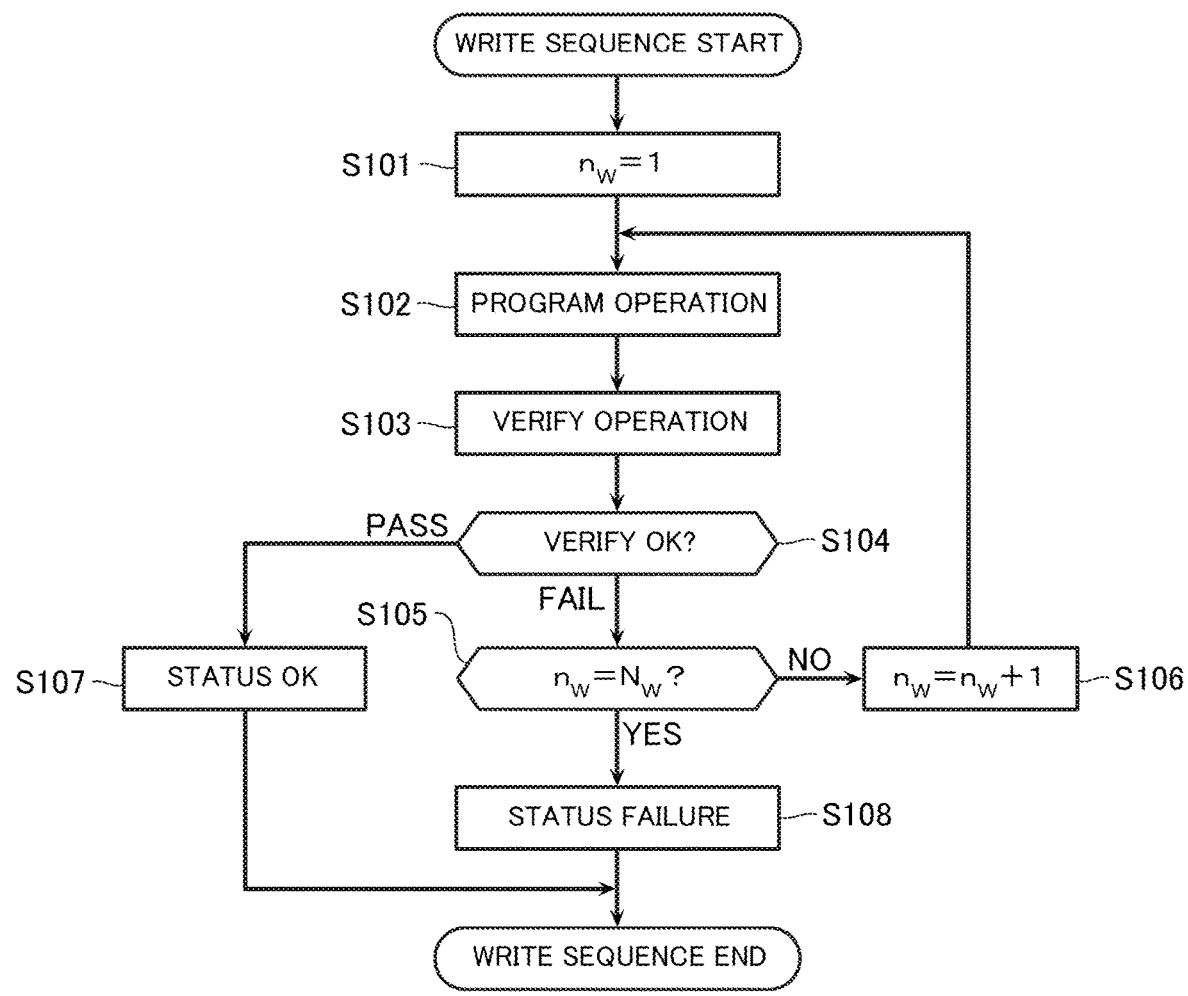
FIG. 14 is a schematic flowchart for describing a write sequence.
Figure 15:
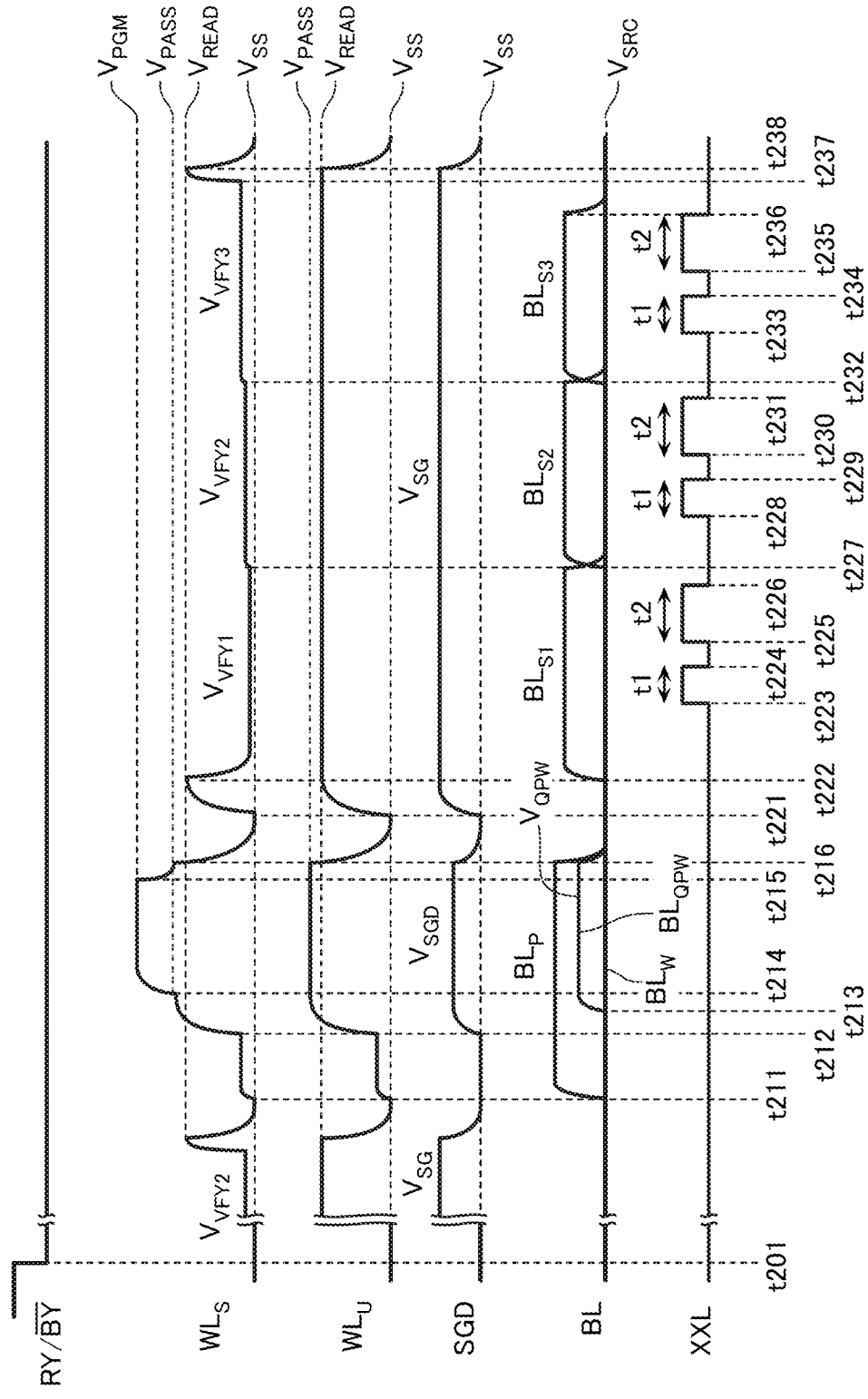
FIG. 15 is a schematic waveform diagram for describing the write sequence.
Figure 16:
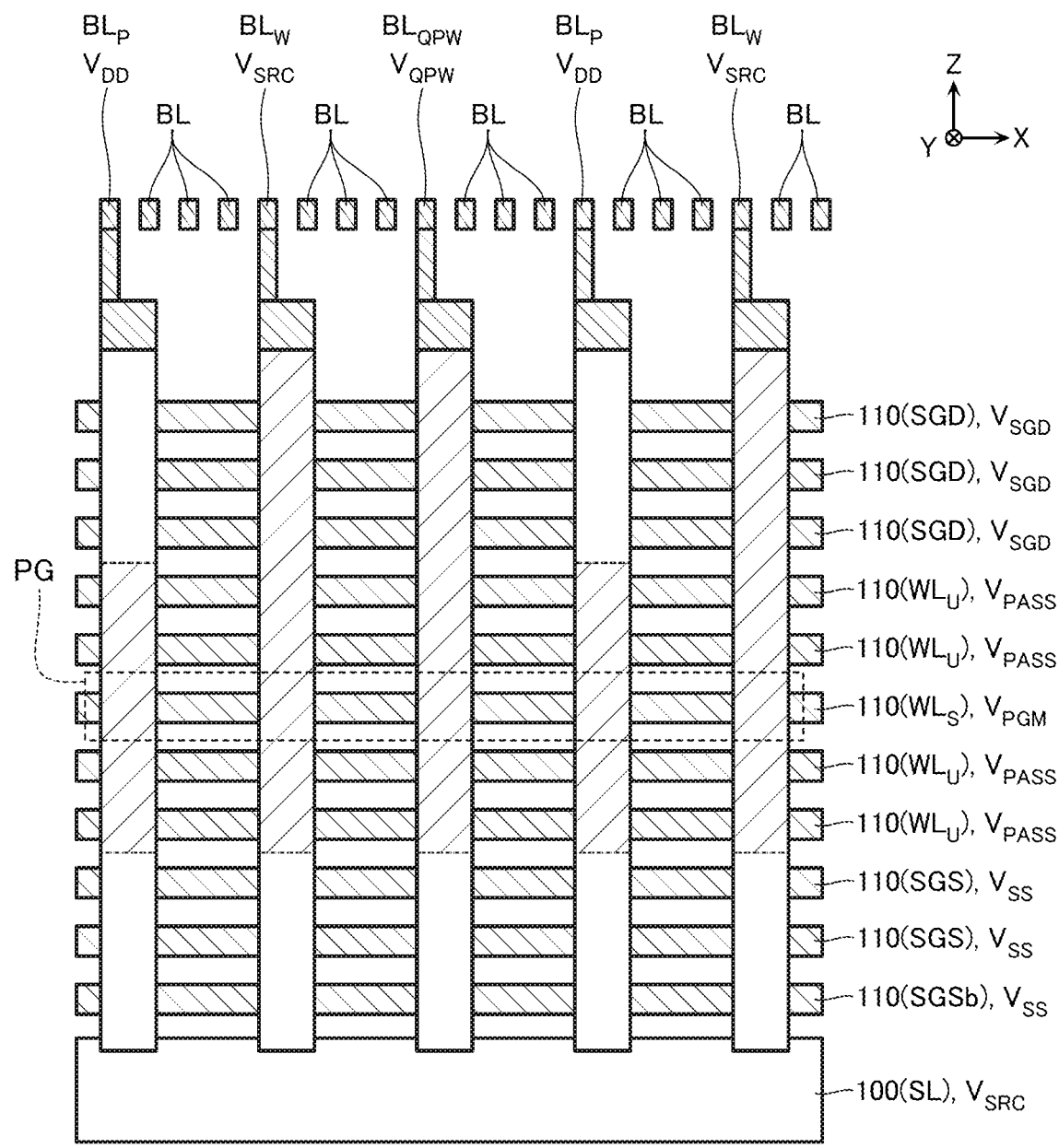
FIG. 16 is a schematic cross-sectional view for describing a program operation.
Figure 17:
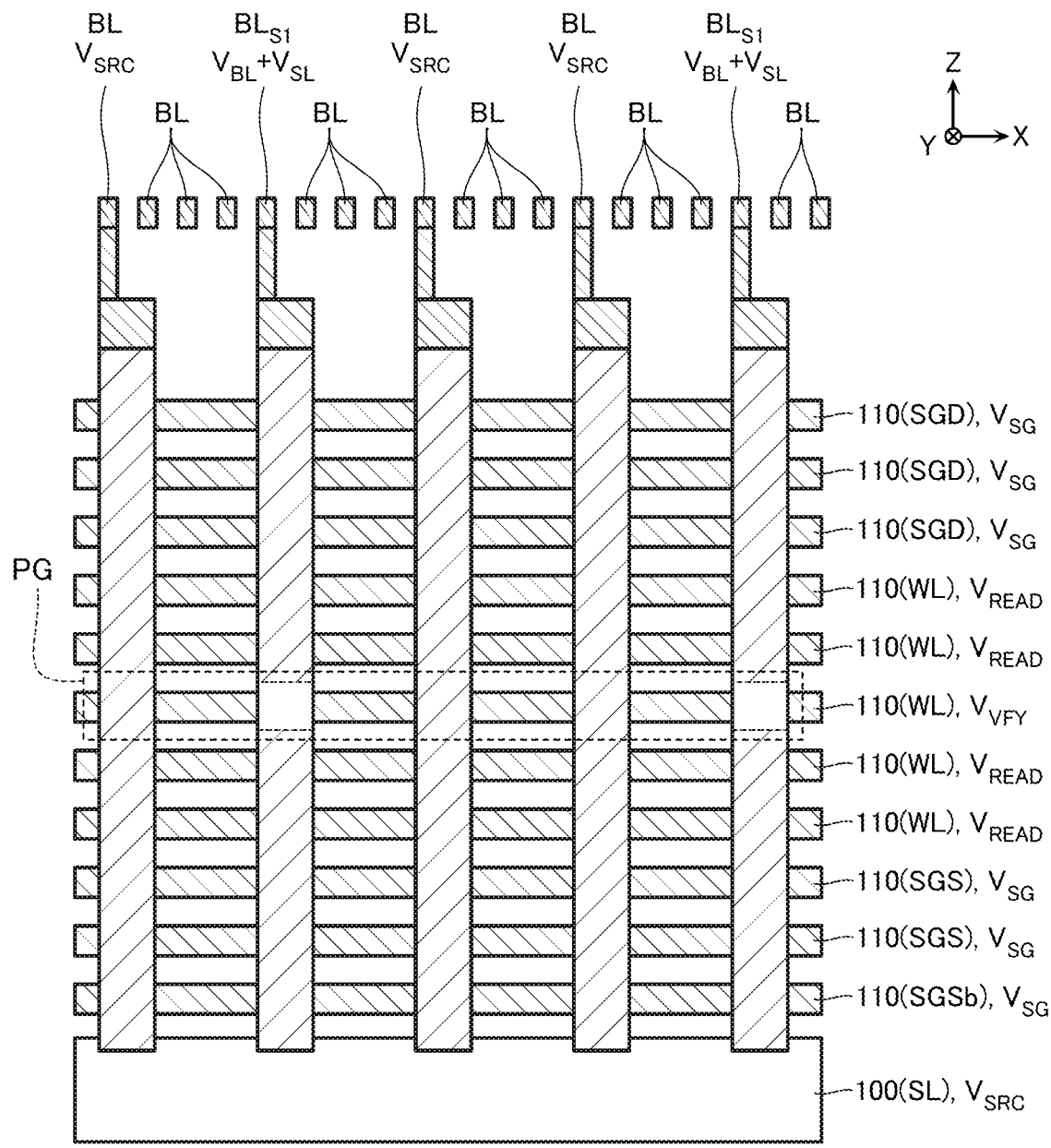
FIG. 17 is a schematic cross-sectional view for describing a verify operation.

Next, with reference to FIG. 14 to FIG. 17, the write sequence of the semiconductor memory device will be described. FIG. 14 is a schematic flowchart for describing the write sequence. FIG. 15 is a schematic waveform diagram for describing the write sequence. FIG. 16 is a schematic cross-sectional view for describing a program operation included in the write sequence. FIG. 17 a schematic cross-sectional view for describing a verify operation included in the write sequence.

Upon executing the write sequence, the command set that causes the write sequence to be executed is input from the controller die CD to the memory die MD. This command set includes the command data $D_{CMD}$ that causes the write sequence to be executed, the address data $D_{ADD}$ that specifies the page PG, the memory block BLK, the memory die MD and the like as an object of the write sequence, and the data DAT written into the memory cell MC in the page PG. In association with this, the terminal RY//BY enters the "L" state at a timing t201 (FIG. 15).

At Step S101 (FIG. 14), a loop count $n_W$ is set to 1. The loop count $n_W$ is a variable that indicates the number of a write loop (a process including Step S102 and Step S103). The loop count $n_W$ is recorded in a register and the like. At this Step, data of the number of the bit lines BL×4 bits recorded in the selected memory cell MC during the write sequence is latched by the latch circuits DL0 to $DLn_L$.

At Step S102, a program operation is performed.

At a timing t211 of the program operation (FIG. 15), for example, a bit line $BL_W$ connected to the selected memory cell MC whose threshold voltage is adjusted among the plurality of selected memory cells MC (hereinafter may be referred to as a "write memory cell MC") is supplied with the voltage $V_{SRC}$, and a bit line $BL_P$ connected to the selected memory cell MC whose threshold voltage is not adjusted among the plurality of selected memory cells MC (hereinafter may be referred to as an "inhibit memory cell MC") is supplied with the voltage $V_{DD}$. For example, the latch circuit SDL (FIG. 7) corresponding to the bit line $BL_W$ is caused to latch "L," and the latch circuit SDL (FIG. 7) corresponding to the bit line $BL_P$ is caused to latch "H." The states of the signal lines STB, XXL, BLC, BLS, HLL, BLX are caused to be "L, L, H, H, L, H."

At a timing t212 of the program operation (FIG. 15), the write memory cell MC is electrically conducted with the bit line $BL_W$ in a selective manner. For example, the voltage $V_{SGD}$ is supplied to the drain side select gate line SGD. the voltage $V_{SGD}$ is, for example, smaller than the voltage $V_{SG}$ in FIG. 12. This causes the drain-side select transistor STD corresponding to the bit line $BL_W$ to which the voltage $V_{SRC}$ is supplied to be in the ON state, and causes the drain-side select transistor STD corresponding to the bit line $BL_P$ to which the voltage $V_{DD}$ is supplied to be in the OFF state.

At the timing t212 of the program operation, the write pass voltage $V_{PASS}$ is supplied to the selected word line $WL_S$ and the non-selected word line $WL_U$, and all the memory cells MC are caused to be in the ON state. The write pass voltage $V_{PASS}$ are, for example, larger than the read pass voltage $V_{READ}$ in FIG. 12.

At a timing t213 of the program operation, a bit line $BL_{QPW}$ connected to the write memory cell MC whose threshold voltage has approached the target value to some extent (hereinafter may be referred to as a "weak write memory cell MC") among the plurality of write memory cells MC is supplied with a voltage $V_{QPW}$. For example, the gate voltage of the clamp transistor 44 in FIG. 7 is adjusted in advance before the timing t213. In this respect, since the bit line $BL_W$ is supplied with the voltage $V_{SRC}$ via the discharge transistor 50, the voltage of the bit line $BL_W$ does not vary. The bit line $BL_P$ is separated from the sense amplifier SA (FIG. 7) by the clamp transistor 44. Next, at the timing t213, the data latched by the latch circuit SDL (FIG. 7) corresponding to the bit line $BL_{QPW}$ is switched from "L" to "H." This switches the voltage of the node COM (FIG. 7) of the sense amplifier SA corresponding to the weak write memory cell MC from the voltage $V_{SRC}$ to the voltage $V_{DD}$. The voltage of the bit line BL corresponding to this is clamped by the clamp transistor 44 and is switched from the voltage $V_{SRC}$ to the voltage $V_{qpw}$.

At a timing t214 of the program operation, the program voltage $V_{PGM}$ is supplied to the selected word line $WL_S$. The program voltage $V_{PGM}$ is larger than the write pass voltage $V_{PASS}$.

Here, for example, as illustrated in FIG. 16, the channel of the semiconductor layer 120 connected to the bit line $BL_W$ is supplied with the voltage $V_{SRC}$. A relatively large electric field is generated between such a semiconductor layer 120 and the selected word line $WL_S$. This causes the electrons in the channel of the semiconductor layer 120 to tunnel into the electric charge accumulating film 132 (FIG. 10) via the tunnel insulating film 131 (FIG. 10). This relatively largely increases the threshold voltage of the write memory cell MC.

The channel of the semiconductor layer 120 connected to the bit line $BL_{QPW}$ is supplied with the voltage $V_{QPW}$. An electric field smaller than the above-described electric field is generated between such a semiconductor layer 120 and the selected word line $WL_S$. This causes the electrons in the channel of the semiconductor layer 120 to tunnel into the electric charge accumulating film 132 (FIG. 10) via the tunnel insulating film 131 (FIG. 10). This increases the threshold voltage of the weak write memory cell MC in a relatively small manner.

The channel of the semiconductor layer 120 connected to the bit line $BL_P$ is in an electrically floating state, and an electric potential of this channel has been increased to approximately the write pass voltage $V_{PASS}$ by capacitive coupling with the non-selected word line $WL_U$. Only an electric field smaller than any of the above-described electric fields is generated between such a semiconductor layer 120 and the selected word line $WL_S$. Accordingly, the electrons in the channel of the semiconductor layer 120 do not tunnel into the electric charge accumulating film 132 (FIG. 10). Accordingly, the threshold voltage of the inhibit memory cell MC does not increase.

At a timing t215 of the program operation, the write pass voltage $V_{PASS}$ is supplied to the selected word line $WL_S$ and the non-selected word line $WL_U$ to cause all the memory cells MC to be in the ON state.

At a timing t216 of the program operation, the ground voltage $V_{SS}$ is supplied to the selected word line $WL_S$, the non-selected word line $WL_U$, and the select gate lines (SGD, SGS, SGSb).

At Step S103 (FIG. 14), the verify operation is performed.

At a timing t221 of the verify operation, for example, as illustrated in FIG. 15, the read pass voltage $V_{READ}$ is supplied to the selected word line $WL_S$ and the non-selected word line $WL_U$ to cause all the memory cells MC to be in the ON state. The voltage $V_{SG}$ is supplied to the select gate lines (SGD, SGS, SGSb) to cause the select transistors (STD, STS, STSb) to be in the ON state.

At a timing t222 of the verify operation, a predetermined verify voltage (the verify voltage $V_{VFY1}$ in the example of FIG. 15) is supplied to the selected word line $WL_S$. This causes a part of the selected memory cells MC to be in the ON state and causes the rest of the selected memory cells MC to be in the OFF state, for example, as illustrated in FIG. 17.

At the timing t222, for example, charging of the bit line BL is performed. In this respect, for example, based on the data in the latch circuit DL0 to $DLn_L$, the bit line BL (a bit line $BL_{S1}$ in the example in FIG. 15) connected to the memory cell MC corresponding to a specific state (the state S1 in the example in FIG. 15) is supplied with a voltage $V_{BL}+V_{SL}$, and the other bit lines BL are supplied with the voltage $V_{SRC}$.

At a timing t223 to a timing t224 of the verify operation, for example, as illustrated in FIG. 15, the sense amplifier module SAM (FIG. 6) detects the ON state/OFF state of the memory cell MC connected to the bit line $BL_{S1}$, and obtains the data indicative of the state of this memory cell MC. In this respect, the latch circuits DL0 to $DLn_L$ may be caused to latch the data indicative of the ON state/OFF state of the memory cell MC and the like.

At a timing t225 to a timing t226 of the verify operation, for example, as illustrated in FIG. 15, the sense amplifier module SAM (FIG. 6) detects the ON state/OFF state of the memory cell MC connected to the bit line $BL_{S1}$, and obtains the data indicative of the state of this memory cell MC. In this respect, the latch circuits DL0 to $DLn_L$ may be caused to latch the data indicative of the ON state/OFF state of the memory cell MC and the like.

Note that a time t1 between the timing t223 to the timing t224 is shorter than a time t2 between the timing t225 to the timing t226. Accordingly, the electric charge discharged from the sense node SEN (FIG. 7) during the timing t223 to the timing t224 is smaller than the electric charge discharged from the sense node SEN (FIG. 7) during the timing t225 to the timing t226.

For example, the memory cell MC determined to be in the OFF state in the data detected during the timing t225 to the timing t226 is highly possible that the threshold voltage has reached the target value. A part of such memory cells MC is treated as the inhibit memory cell MC in and after the next write loops.

For example, the memory cell MC determined to be in the ON state in the data detected between the timing t225 and the timing t226 and determined to be in the OFF state in the data detected between the timing t223 and the timing t224 is highly possible that the threshold voltage is approaching the target value to some extent. At least a part of such memory cells MC is treated as the weak write memory cell MC in the next write loops.

For example, the memory cell MC determined to be in the ON state in the data detected between the timing t223 to the timing t224 is highly possible that the threshold voltage is away from the target value to some extent. At least a part of such memory cells MC is treated as the write memory cell MC in the next write loops.

At a timing t227 to a timing t231 of the verify operation, the same process as the process performed during the timing t222 to the timing t226 is performed on the memory cell MC in another state (the state S2 in the example in FIG. 15). Note that, in FIG. 15, the bit line BL connected to the memory cell MC corresponding to the state S2 is described as a bit line $BL_{S2}$.

At a timing t232 to a timing t236 of the verify operation, the same process as the process performed during the timing t222 to the timing t226 is performed on the memory cell MC in another state (the state S3 in the example in FIG. 15). Note that, in FIG. 15, the bit line BL connected to the memory cell MC corresponding to the state S3 is described as a bit line $BL_{S3}$.

At a timing t237, the read pass voltage $V_{READ}$ is supplied to the selected word line $WL_S$ and the non-selected word line $WL_U$ to cause all the memory cells MC to be in the ON state. The voltage $V_{SG}$ is supplied to the select gate lines (SGD, SGS, SGSb) to cause the select transistors (STD, STS, STSb) to be in the ON state.

At a timing t238 of the verify operation, the ground voltage $V_{SS}$ is supplied to the selected word line $WL_S$, the non-selected word line $WL_U$, and the select gate lines (SGD, SGS, SGSb).

Afterwards, the data latched by the latch circuit SDL is transferred to a counter circuit (not illustrated) to count the number of the memory cell MC whose threshold voltage has reached the target value or the number of the memory cell MC whose threshold voltage has not reached the target value.

Note that the example in FIG. 15 illustrated the example where three patterns of the verify voltages $V_{VFY}$ are supplied to the selected word line $WL_S$ in the verify operation. However, the number of the verify voltage $V_{VFY}$ supplied to the selected word line $WL_S$ in the verify operation may be two patterns or less, may be four patterns or more, or may vary corresponding to the loop count $n_W$.

At Step S104 (FIG. 14), the result of the verify operation is determined. For example, with reference to the above-described counter circuit, for example, when the number of the memory cells MC whose threshold voltages have not reached the target value is equal to or more than a certain number, it is determined to be verify FAIL, and the procedure proceeds to Step S105. On the other hand, for example, when the number of the memory cells MC whose threshold voltages have not reached the target value is equal to or less than the certain number, it is determined to be verify PASS, and the procedure proceeds to Step S107.

At Step S105, it is determined whether the loop count $n_W$ has reached a predetermined number $N_W$ or not. When it has not reached, the procedure proceeds to Step S106. When it has reached, the procedure proceeds to Step S108.

At Step S106, 1 is added to the loop count $n_W$, and the procedure proceeds to Step S102. At Step S106, for example, a predetermined voltage $\Delta V$ is added to the program voltage $V_{PGM}$. Accordingly, the program voltage $V_{PGM}$ increases with the increase of the loop count $n_W$.

At Step S107, the status data $D_{ST}$ that the write sequence has been normally terminated is stored in the status register STR (FIG. 4), and the write sequence is terminated. Note that the status data $D_{ST}$ is output to the controller die CD (FIG. 1) by status read operation.

At Step S108, the status data $D_{ST}$ that the write sequence has not been normally terminated is stored in the status register STR (FIG. 2), and the write sequence is terminated.

[Determination Method for Threshold Voltage]

Figure 19:
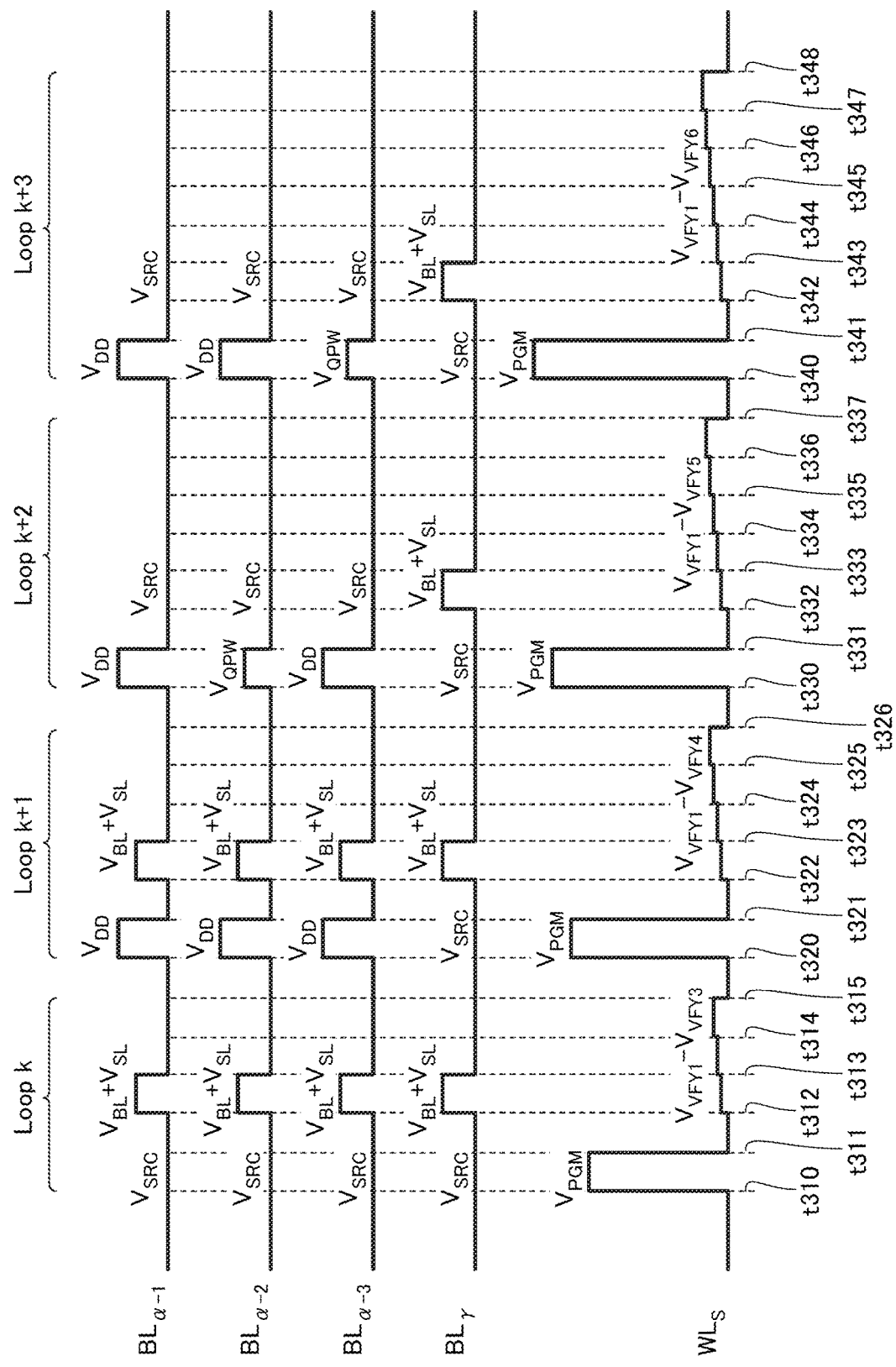
FIG. 19 is a schematic waveform diagram for describing the write sequence.

Next, with reference to FIG. 18 and FIG. 19, a determination method for the threshold voltage and the like in the write sequence will be described. FIG. 18 is a drawing illustrating the method. FIG. 19 is a schematic waveform diagram for describing the method.

$\alpha$-1 to $\alpha$-3, $\beta$-1 to $\beta$-3, and $\gamma$ in FIG. 18 each are one of the memory cells MC corresponding to the state S1. A bit line $BL_{\alpha-1}$ to a bit line $BL_{\alpha-3}$ in FIG. 19 are the bit lines BL connected to $\alpha$-1 to $\alpha$-3, respectively. A bit line $BL_\gamma$ in FIG. 19 is the bit line BL connected to $\gamma$.

In the program operation of a k-th (k is a natural number) write loop (Loop k), as illustrated in FIG. 18, α-1 to α-3, β-1 to β-3, and γ are all treated as the write memory cells MC. Therefore, in the example in FIG. 19, at timings t310 to t311 corresponding to this program operation, the voltage $V_{SRC}$ is supplied to the bit line $BL_{\alpha-1}$ to the bit line $BL_{\alpha-3}$, and the bit line $BL_\gamma$.

In the verify operation of the k-th write loop (Loop k), for example, as illustrated in FIG. 19, at timings t312 to t313 where the verify voltage $V_{VFY1}$ is supplied to the selected word line $WL_S$, the voltage $V_{BL}+V_{SL}$ is supplied to the bit lines BL corresponding to α-1 to α-3, β-1 to β-3, and γ. At timings t313 to t315 where the verify voltage $V_{VFY2}$ and the verify voltage $V_{VFY3}$ are supplied to the selected word line $WL_S$, the voltage $V_{src}$ is supplied to these bit lines BL. Note that, as illustrated in FIG. 18, in a process (VL) corresponding to the timing t223 to t224 (FIG. 15) of the k-th write loop, α-1 to α-3 and β-1 to β-3 are determined to be in the OFF state, and γ is determined to be in the ON state. In a process (VH) corresponding to the timing t225 to t226 (FIG. 15), α-1 to α-3 are determined to be in the OFF state, and β-1 to β-3 and γ are determined to be in the ON state.

In the program operation of a k+1st write loop (Loop k+1), as illustrated in FIG. 18, α-1 to α-3 and β-1 to β-3 are temporarily the inhibit memory cells MC, and γ is the write memory cell MC. Therefore, in the example in FIG. 19, at timings t320 to t321 corresponding to this program operation, the voltage $V_{DD}$ is supplied to the bit line $BL_{\alpha-1}$ to the bit line $BL_{\alpha-3}$, and the voltage $V_{SRC}$ is supplied to the bit line $BL_\gamma$.

In the verify operation of the k+1st write loop (Loop k+1), for example, as illustrated in FIG. 19, at timings t322 to t323 where the verify voltage $V_{VFY1}$ is supplied to the selected word line $WL_S$, the voltage $V_{BL}+V_{SL}$ is supplied the bit lines BL corresponding to α-1 to α-3, β-1 to β-3, and γ. At timings t323 to t326 where the verify voltage $V_{VFY2}$ to the verify voltage $V_{VFY4}$ are supplied to the selected word line $WL_S$, the voltage $V_{SRC}$ is supplied to these bit lines BL. Note that, as illustrated in FIG. 18, in the process (VL) corresponding to the timings t223 to t224 (FIG. 15) of the k+1st write loop, α-1, α-2, β-1, and β-2 are determined to be in the OFF state, and α-3, β-3, and γ are determined to be in the ON state. In the process (VH) corresponding to the timings t225 to t226 (FIG. 15), α-1 and β-1 are determined to be in the OFF state, and α-2, α-3, β-2, β-3, and γ are determined to be in the ON state.

In the program operation of a k+2nd write loop (Loop k+2), as illustrated in FIG. 18, α-1 is treated as the inhibit memory cell MC, α-2, β-1, and β-2 are treated as the weak write memory cells MC, α-3 and β-3 are temporarily treated as the inhibit memory cells MC, and γ is treated as the write memory cell MC. Therefore, in the example in FIG. 19, at timings t330 to t331 corresponding to this program operation, the voltage $V_{DD}$ is supplied to the bit line $BL_{\alpha-1}$ and the bit line $BL_{\alpha-3}$, the voltage $V_{QPW}$ is supplied to the bit line $BL_{\alpha-2}$, the voltage $V_{SRC}$ is supplied to the bit line $BL_\gamma$.

In the verify operation of the k+2nd write loop (Loop k+2), for example, as illustrated in FIG. 19, at timings t332 to t333 where the verify voltage $V_{VFY1}$ is supplied to the selected word line $WL_S$, the voltage $V_{SRC}$ is supplied to the bit lines BL corresponding to α-1 to α-3 and β-1 to β-3, and the voltage $V_{BL}+V_{SL}$ is supplied to the bit line BL corresponding to γ. At timings t333 to t337 where the verify voltage $V_{VFY2}$ to a verify voltage $V_{VFY5}$ are supplied to the selected word line $WL_S$, the voltage $V_{SRC}$ is supplied to these bit lines BL. Note that, in the process (VL) corresponding to the timings t223 to t224 (FIG. 15) of the k+2nd write loop, γ is determined to be in the ON state. In the process (VH) corresponding to the timings t225 to t226 (FIG. 15), γ is determined to be in the ON state.

In the program operation of a k+3rd write loop (Loop k+3), as illustrated in FIG. 18, α-1, α-2, β-1, and β-2 are treated as the inhibit memory cells MC, α-3 and β-3 are treated as weak write memory cells MC, and γ is treated as the write memory cell MC. Therefore, in the example in FIG. 19, at timings t340 to t341 corresponding to this program operation, the voltage $V_{DD}$ is supplied to the bit line $BL_{\alpha-1}$ and the bit line $BL_{\alpha-2}$, the voltage $V_{QPW}$ is supplied to the bit line $BL_{\alpha-3}$, and the voltage $V_{SRC}$ is supplied to the bit line $BL_\gamma$.

In the verify operation of the k+3rd write loop (Loop k+3), for example, as illustrated in FIG. 19, at timings t342 to t343 where the verify voltage $V_{VFY1}$ is supplied to the selected word line $WL_S$, the voltage $V_{SRC}$ is supplied to the bit lines BL corresponding to α-1 to α-3 and β-1 to β-3, and the voltage $V_{BL}+V_{SL}$ is supplied to the bit line BL corresponding to γ. At timings t343 to t348 where the verify voltage $V_{VFY2}$ to a verify voltage $V_{VFY6}$ are supplied to the selected word line $WL_S$, the voltage $V_{SRC}$ is supplied to these bit lines BL. Note that, in the process (VL) corresponding to the timings t223 to t224 (FIG. 15) of k+3rd write loop, γ is determined to be in the ON state. In the process (VH) corresponding to the timings t225 to t226 (FIG. 15), γ is determined to be in the ON state.

Here, α-1 is determined to be in the OFF state in both the process (VL in FIG. 18) corresponding to the timings t223 to t224 and the process (VH in FIG. 18) corresponding to the timings t225 to t226 of the verify operation of the k-th write loop. α-1 is determined to be in the OFF state in both the process (VL in FIG. 18) corresponding to the timings t223 to t224 and the process (VH in FIG. 18) corresponding to the timings t225 to t226 of the verify operation of the k+1st write loop. Such a memory cell MC is highly possible that the threshold voltage has actually reached the target value. Accordingly, in this embodiment, α-1 is treated as the inhibit memory cell MC in the process after this in the write sequence.

α-2 is determined to be in the OFF state in both the process (VL in FIG. 18) corresponding to the timings t223 to t224 and the process (VH in FIG. 18) corresponding to the timings t225 to t226 of the verify operation of the k-th write loop. While α-2 is determined to be in the OFF state in the process (VL in FIG. 18) corresponding to the timings t223 to t224 of the verify operation of the k+1st write loop, it is determined to be in the ON state in the process (VH in FIG. 18) corresponding to the timings t225 to t226. Such a memory cell MC is highly possible that the threshold voltage is approaching the target value to some extent. However, it is also possible that the threshold voltage has not reached the target value in practice. Accordingly, in this embodiment, α-2 is treated as the weak write memory cell MC in the program operation of the k+2nd write loop, and α-2 is treated as the inhibit memory cell MC in the process after it.

α-3 is determined to be in the OFF state in both the process (VL in FIG. 18) corresponding to the timings t223 to t224 and the process (VH in FIG. 18) corresponding to the timings t225 to t226 of the verify operation of the k-th write loop. However, α-3 is determined to be in the ON state in the process (VL in FIG. 18) corresponding to the timings t223 to t224 and the process (VH in FIG. 18) corresponding to the timings t225 to t226 of the verify operation of the k+1st write loop. Such a memory cell MC is, for example, possible that the threshold voltage is close to the target value compared with γ. However, it is highly possible that the threshold voltage has not reached the target value in practice. Accordingly, in the embodiment, α-3 is temporarily treated as the inhibit memory cell MC in a k+2nd program operation, α-3 is treated as the weak write memory cell MC in the program operation of the k+3rd write loop, and α-3 is treated as the inhibit memory cell MC in the process after it. As illustrated in FIG. 19, the program voltage $V_{PGM}$ in the k+3rd write loop is larger than the program voltage $V_{PGM}$ in the k+2nd write loop. Accordingly, the electric charge accumulating film 132 of α-3 has more electric charge accumulation than the electric charge accumulating film 132 of α-2 has.

In this embodiment, the similar process to that performed on α-2 is performed on β-1 and β-2. In this embodiment, the similar process to that performed on α-3 is performed on β-3.

[Read Disturb]

In the example in FIG. 11, the 4 bit data is recorded in one memory cell MC by controlling the threshold voltage of the memory cell MC into sixteen patterns of states. In such an aspect, it is preferred to accurately control the threshold voltage of the memory cell MC.

Here, in the above-described verify operation (Step S103 in FIG. 14), there may be a case where a threshold voltage higher than the actual threshold voltage of the memory cell MC is detected or a threshold voltage lower than the actual threshold voltage of the memory cell MC is detected. Hereinafter, such a phenomenon may be referred to as a "read disturb."

When the read disturb occurs, for example, there may be a case where the memory cell MC with a threshold voltage that has not reached the target value is determined that the threshold voltage has reached the target value. The threshold voltage of such a memory cell MC does not fall within the width of the desired threshold distribution as illustrated in FIG. 11 in some cases. When the number of such memory cells MC increases, there may be a case where the width of the threshold distribution as illustrated in FIG. 11 widens to increase a bit error rate.

[Improvement of Bit Error Rate by Multiple Times of Verify Operation]

In order to improve the bit error rate, for example, execution of the above-described verify operation (Step S103 in FIG. 14) for multiple times is considered. However, for example, when the number of executions of the verify operation in the one write loop is increased, the time required for the write sequence could be substantially increased.

To execute the verify operation for the multiple times without increasing the time required for the write sequence, for example, executing the verify operation across a plurality of the write loops is considered. For example, when a threshold voltage of a certain memory cell MC is determined to have reached the target value in the verify operation corresponding to the k-th write loop, it is considered that this memory cell MC is temporarily treated as the inhibit memory cell MC in the program operation corresponding to the k+1st write loop, and the verify operation is executed again on this memory cell MC in the verify operation corresponding to the k+1st write loop. When the threshold voltage of this memory cell MC is determined not to have reached the target value in the verify operation corresponding to the k+1st write loop, it is considered that this memory cell MC is treated as the write memory cell MC in the program operation corresponding to the k+2nd write loop.

However, as described above, the program voltage $V_{PGM}$ increases together with the increase of the loop count $n_W$. Accordingly, in the case described above, in the program operation corresponding to the k+2nd write loop, the program voltage $V_{PGM}$ exceeding an appropriate magnitude is supplied to the above-described memory cell MC, and the threshold voltage of this memory cell MC could increase and exceed the desired range. When the number of such memory cells MC increases, there may be a case where the width of the threshold distribution as illustrated in FIG. 11 widens to increase the bit error rate.

In order to reduce such a phenomenon, for example, it is considered that the memory cell MC as described above is treated as the weak write memory cell MC instead of the write memory cell MC in the program operation corresponding to the above-described k+2nd write loop. It is also considered that the voltage $V_{QPW}$ supplied to the bit line $BL_{QPW}$ in the program operation is set to be a relatively large voltage. When the threshold voltage of this weak write memory cell MC is determined to have reached the target value in a certain write loop, it is considered that this memory cell MC is treated as the inhibit memory cell MC in the write loop after this. With such a method, the number of the electrons that tunnel into the electric charge accumulating film 132 of the memory cell MC as described above substantially decreases in the program operation corresponding to the above-described k+2nd write loop. Accordingly, it is possible to reduce the increase of the threshold voltage exceeding the desired range.

However, with such a method, the verify operation is executed on the memory cell MC whose threshold voltage has approached the target value to some extent for multiple times. When the read disturb occurs in such a state, it is highly possible that such a memory cell MC is determined that the threshold voltage has reached the target value.

Effect of First Embodiment

Since in the write sequence according to the first embodiment, the verify operation is executed for the multiple times, the effect of the read disturb can be reduced compared with the case where the verify operation is executed just once.

Since in the write sequence according to the embodiment, the verify operation is executed across the plurality of write loops for the multiple times, the substantial increase of the time required for the write sequence as described above does not occur.

In the write sequence according to the embodiment, the memory cells MC are classified into some kinds corresponding to the results of multiple times of the verify operations and writing is executed at an appropriate timing corresponding to these classifications to adjust strength of writing. With such a method, it is possible to preferably reduce the effect of the read disturb to accumulate an appropriate amount of electric charge on the electric charge accumulating film 132 of the memory cell MC whose threshold voltage has approached the target value to some extent.

Second Embodiment

Figure 20:
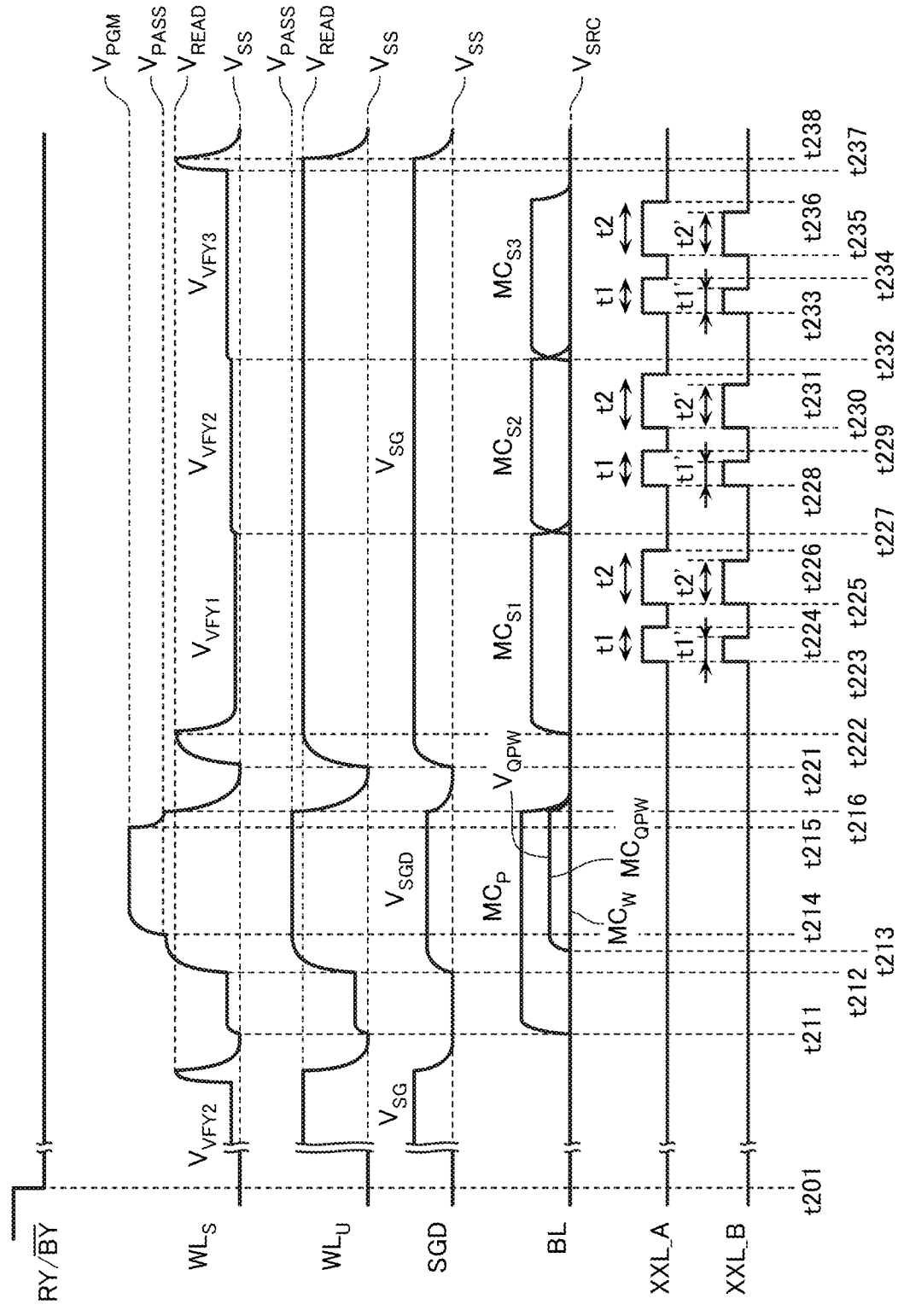
FIG. 20 is a schematic waveform diagram for describing a write sequence according to a second embodiment.
Figure 22:
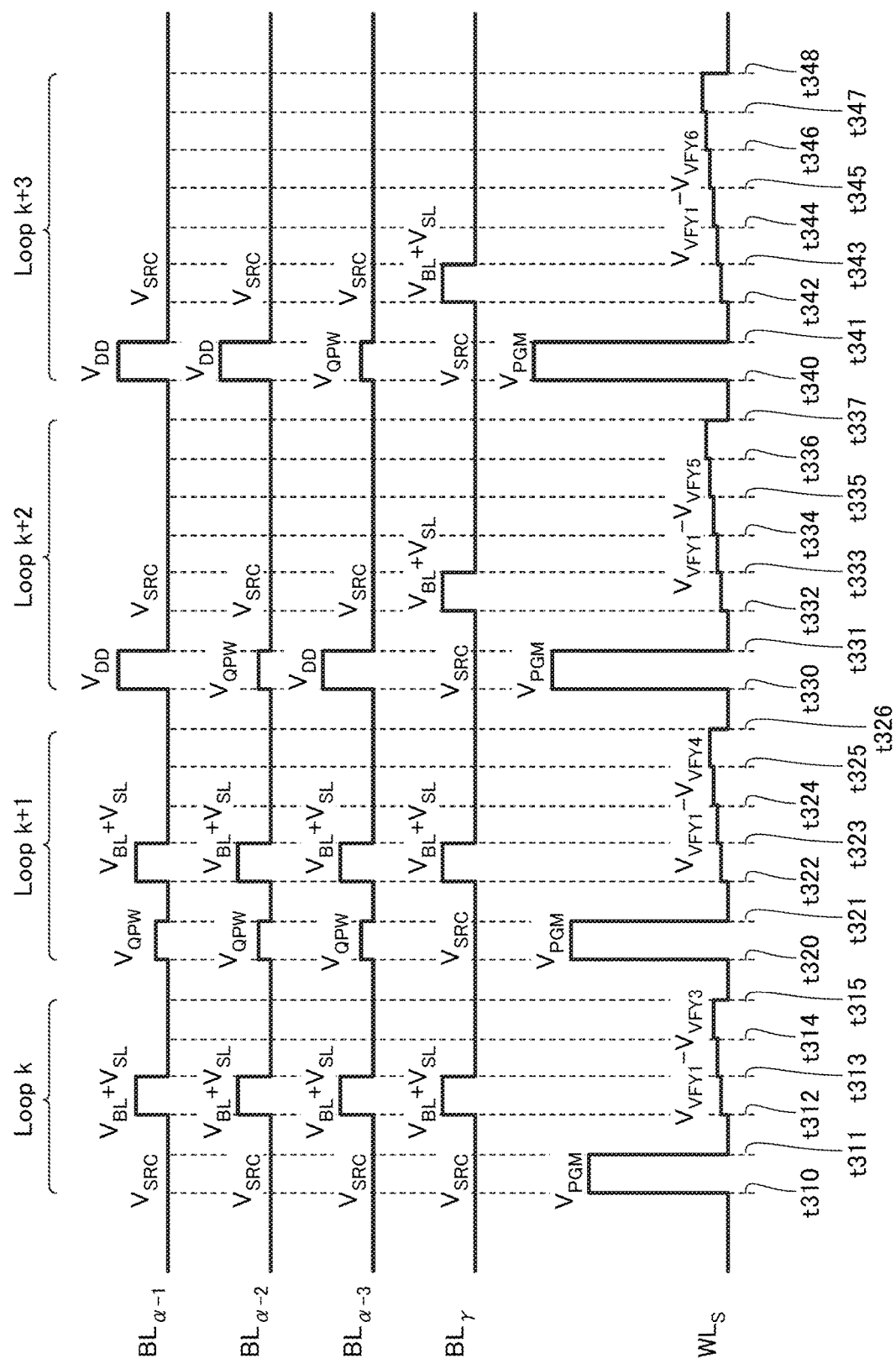
FIG. 22 is a schematic waveform diagram for describing the write sequence according to the second embodiment.

Next, with reference to FIG. 20 to FIG. 22, a semiconductor memory device according to a second embodiment will be described. FIG. 20 is a schematic waveform diagram for describing a write sequence according to the second embodiment.

The write sequence according to the second embodiment is basically executed similarly to the first embodiment.

However, as illustrated in FIG. 20, in the second embodiment, the signal that corresponds to the signal line XXL (the signal input to the gate electrode of the discharge transistor 43 in FIG. 7) is controlled in two patterns (XXL_A, XXL_B). For example, in this embodiment, such a signal is configured to be controllable in two patterns in accordance with the data latched by any of the latch circuits DL0 to DLn$_L$. For example, the sense amplifier SA according to the second embodiment may include a switch circuit such as a MOS transistor connected between the gate electrode of the discharge transistor 43 and the sequencer SQC, and a switch circuit such as a MOS transistor connected between the gate electrode of the discharge transistor 43 and the latch circuits DL0 to DLn$_L$.

With the pattern of XXL_A, the signal input to the gate electrode of the discharge transistor 43 is controlled similarly to the signal line XXL according to the first embodiment. That is, from the timing t223 to the timing t224, from the timing t228 to the timing t229, and from the timing t233 to the timing t234 of the verify operation, the signal is in the "H" state during the time t1. From the timing t225 to the timing t226, from the timing t230 to the timing t231, and from the timing t235 to the timing t236 of the verify operation, the signal is in the "H" state during the time t2.

With the pattern of XXL_B, the signal input to the gate electrode of the discharge transistor 43 is basically controlled similarly to the signal line XXL according to the first embodiment. Also with the pattern of XXL_B, the signal input to the gate electrode of the discharge transistor 43 is in the "H" state at the timing t223, the timing t228, and the timing t233 of the verify operation similarly to the signal line XXL according to the first embodiment. However, with the pattern of XXL_B, a time t1' that takes from the signal input to the gate electrode of the discharge transistor 43 entering into the "H" state to entering into the "L" state is shorter than the time t1. Also with the pattern of XXL_B, the signal input to the gate electrode of the discharge transistor 43 is in the "H" state at the timing t225, the timing t230, and the timing t235 of the verify operation similarly to the signal line XXL according to the first embodiment. However, with the pattern of XXL_B, a time t2' that takes from the signal input to the gate electrode of the discharge transistor 43 entering into the "H" state to entering into the "L" state is shorter than the time t2.

In this embodiment, at the timing of start executing the write sequence, the signal input to the gate electrodes of the discharge transistors 43 corresponding to all the write memory cells MC are controlled in the pattern of XXL_B. when any of the memory cells MC is determined to be in the OFF state in the process corresponding to the timing t223, the timing t228, and the timing t233 of the verify operation corresponding to any of the write loops, the data inverts in the latch circuits DL0 to DLn$_L$ corresponding to these memory cells MC. In the write loop next to this, the signal input to the gate electrodes of the discharge transistors 43 corresponding to these memory cells MC is controlled in the pattern of XXL_A.

Next, with reference to FIG. 21 and FIG. 22, a determination method for the threshold voltage in the write sequence according to the second embodiment and the like will be described. FIG. 21 is a drawing illustrating the method. FIG. 22 is a schematic waveform diagram for describing the method.

As illustrated, the determination method for the threshold voltage according to the second embodiment is basically executed similarly to the first embodiment.

However, in the program operation of the k+1st write loop (Loop k+1) according to the second embodiment, as illustrated in FIG. 21, α-1 to α-3 and β-1 to β-3 are treated as the weak write memory cells MC instead of the inhibit memory cells MC. Therefore, in the example in FIG. 22, the voltage V$_{QPW}$ is supplied to the bit line BL$_{\alpha-1}$ to the bit line BL$_{\alpha-3}$ at the timings t320 to t321 corresponding to this program operation.

[Variation of Threshold Voltage of Drain-Side Select Transistor STD]

In the first embodiment, it is preferred to set the voltage V$_{QPW}$ supplied to the bit line BL$_{QPW}$ to be a relatively large voltage. Even when the program voltage V$_{PGM}$ supplied to the selected word line WL$_S$ in the program operation has been set to be a large voltage to some extent, this decreases the voltage supplied between the semiconductor layer 120 connected to the bit line BL$_{QPW}$ and the selected word line WL$_S$ to reduce the increased amount of the threshold voltage of the memory cell MC. This, for example, can reduce the increase of the threshold voltage of the memory cell MC exceeding the desired range in the k+2nd write loop in FIG. 18.

However, when the voltage V$_{QPW}$ is set to be a relatively large voltage, there may be a case where the variation of the threshold voltage of the drain-side select transistor STD needs to be more strictly controlled.

That is, as described above, at the timing t212 (FIG. 15) of the program operation, in the state where the voltage V$_{SRC}$ is supplied to the bit line BL$_W$ and the voltage V$_{DD}$ is supplied to the bit line BL$_P$, the voltage V$_{SGD}$ is supplied to the drain side select gate line SGD. This causes the drain-side select transistor STD corresponding to the bit line BL$_W$ to which the voltage V$_{SRC}$ is supplied to be in the ON state and the drain-side select transistor STD corresponding to the bit line BL$_P$ to which the voltage V$_{DD}$ is supplied to be in the OFF state.

To achieve such a state, a magnitude obtained by subtracting the threshold voltage of the drain-side select transistor STD from the voltage V$_{SGD}$ needs to be adjusted within a range between the voltage V$_{SRC}$ and the voltage V$_{DD}$ for a plurality of the drain-side select transistors STD included in the memory cell array MCA.

Furthermore, at the timing t213 of the program operation, the voltage V$_{QPW}$ is supplied to the bit line BL$_{QPW}$ and the voltage V$_{QPW}$ is also supplied to the semiconductor layer 120 connected to the bit line BL$_{QPW}$.

To achieve such a state, a magnitude obtained by subtracting the threshold voltage of the drain-side select transistor STD from the voltage V$_{SGD}$ needs to be adjusted within a range between the voltage V$_{QPW}$ and the voltage V$_{DD}$ for the plurality of drain-side select transistors STD included in the memory cell array MCA. Accordingly, the larger the above-described voltage V$_{QPW}$ is, the more strictly the variation of the threshold voltage of the drain-side select transistor STD needs to be controlled.

Effect of Second Embodiment

In the write sequence according to the second embodiment, as described with reference to FIG. 22, at the timing of start executing the write sequence, the signal input to the gate electrodes of the discharge transistors 43 corresponding to all the write memory cells MC is controlled in the pattern of XXL_B. Here, the time t1' corresponding to the pattern of XXL_B is shorter than the time t1 corresponding to the pattern of XXL_A. Accordingly, the memory cell MC controlled in the pattern of XXL_B is easily determined to be in the OFF state in the verify operation. That is, the threshold voltage observed by the verify operation of the memory cell MC controlled in the pattern of XXL_B is apparently looked larger than the actual threshold voltage.

In the write sequence according to the second embodiment, in the process corresponding to the timing t223, the timing t228, and the timing t233 of the verify operation corresponding to any of the write loops, when any of the memory cells MC is determined to be in the OFF state, as described with reference to FIG. 21, these memory cells MC are treated as the weak write memory cells MC in the next write loop (the write loop corresponding to Loop k+1 of FIG. 21) and writing to these memory cells MC is executed. This increases the threshold voltages of these memory cells MC.

In the write sequence according to the second embodiment, in the write loop corresponding to Loop k+1 in FIG. 21, the signal input to the gate electrode of the discharge transistor 43 corresponding to the above-described memory cell MC is controlled in the pattern of XXL_A. Here, the threshold voltage observed by the verify operation of the memory cell MC controlled in the pattern of XXL_A is similar to the actual threshold. Accordingly, in this write loop, the threshold voltage observed by the verify operation is apparently looked decreased. This cancels the increase of the threshold voltage in the program operation immediately before this. Therefore, in the verify operation corresponding to Loop k+1 in FIG. 21, apparently, the threshold voltages of these memory cells MC are looked as if they have not changed.

In such a method, with a smaller number of the write loops than in the first embodiment, the memory cell MC with the threshold voltage that has approached the target value to some extent can be detected. Accordingly, before the program voltage $V_{PGM}$ increases more than necessary, each of the memory cells MC can be treated as the weak write memory cell MC.

Accordingly, compared with the first embodiment, the voltage $V_{QPW}$ supplied to the bit line $BL_{QPW}$ can be decreased.

Third Embodiment

Next, with reference to FIG. 23 to FIG. 25, a semiconductor memory device according to the third embodiment will be described.

The semiconductor memory device according to the third embodiment is basically configured similarly to the semiconductor memory device according to the first embodiment or the second embodiment. However, in the semiconductor memory device according to the third embodiment, a foggy fine write is executed. In the foggy fine write, a foggy write and a fine write are executed.

As illustrated in FIG. 23, the foggy write and the fine write are executed in the following order. That is, first, the foggy write is executed on a page PG0. Next, the foggy write is executed on a page PG1, and the fine write is executed on the page PG0. Next, the foggy write is executed on a page PG2, and the fine write is executed on the page PG1. Similarly in the following, the foggy write is executed on a page $PGn_P$ as a $2n_F$-th ($n_F$ is a natural number) write sequence, and the fine write is executed on the page $PGn_P-1$ as a $2n_F+1$st write sequence.

Figure 24:
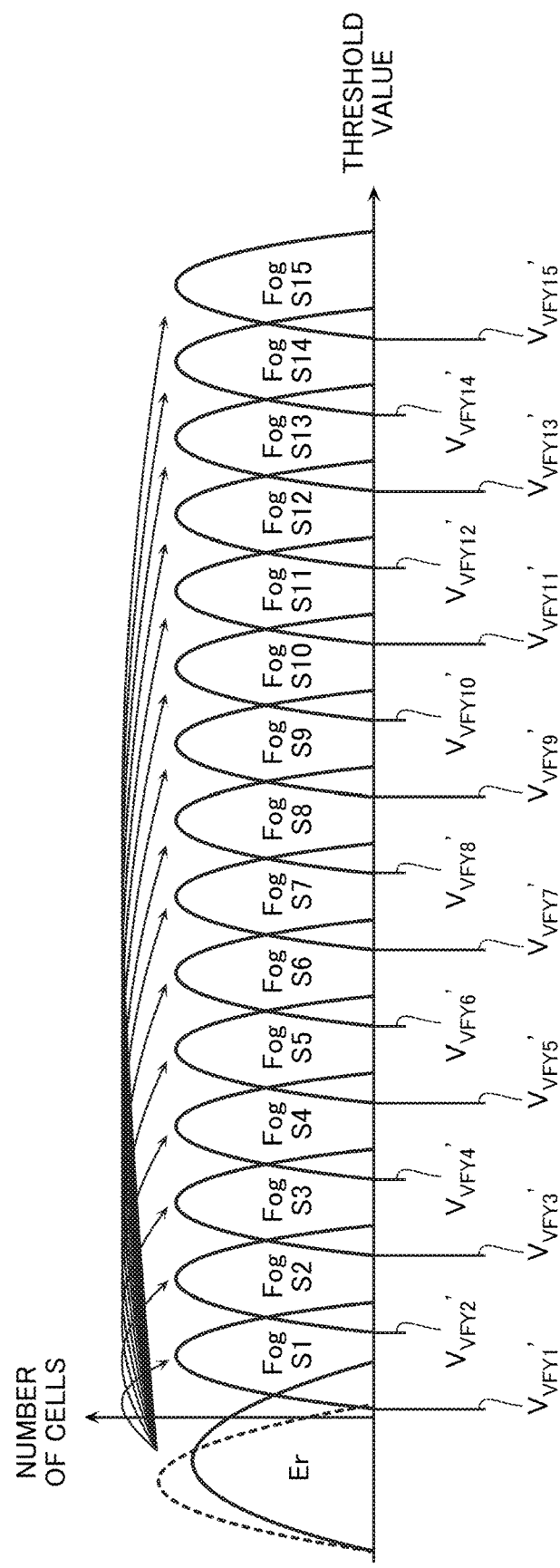
FIG. 24 is a schematic histogram for describing the write sequence according to the third embodiment.

As illustrated in FIG. 24, the foggy write is executed on the page PG in the erase state. In the foggy write, as illustrated in FIG. 24, the threshold voltage of the memory cell MC in the page PG is controlled to the threshold voltage corresponding to a state FogS1 to a state FogS15 by one write sequence.

The foggy write is basically executed similarly to the write sequence according to the first embodiment or the second embodiment.

However, a verify voltage $V_{VFY1}'$ to a verify voltage $V_{VFY15}'$ used in the foggy write are smaller than the verify voltage $V_{VFY1}$ to the verify voltage $V_{VFY15}$ described with reference to FIG. 11.

In the foggy write, the voltage $\Delta V$ added to the program voltage $V_{PGM}$ at Step S106 of FIG. 14 may be larger than the voltage $\Delta V$ in the fine write.

For example, in the example in FIG. 15, the ON state/OFF state of the memory cell MC corresponding to each of the states are detected twice in the verify operation. On the other hand, in the foggy write, the ON state/OFF state of the memory cell MC corresponding to each of the states may be detected twice or may be detected only once. In the latter case, the voltage supplied to the bit line BL in the program operation may be in two patterns of the voltage $V_{DD}$ or the voltage $V_{SRC}$.

Figure 25:
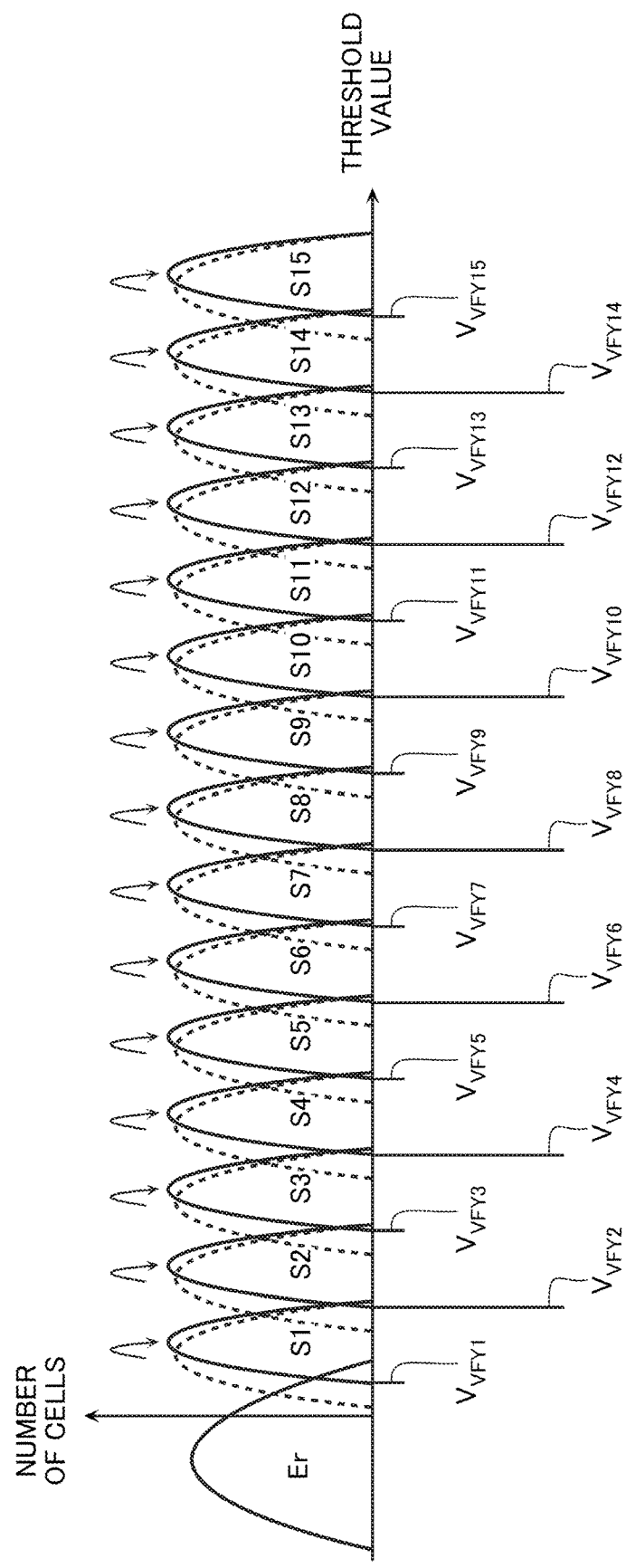
FIG. 25 is a schematic histogram for describing the write sequence according to the third embodiment.

As illustrated in FIG. 25, the fine write is executed on the page $PGn_P$ when the foggy write has already been executed on the page $PGn_P$ and the page $PGn_P+1$. In the fine write, as illustrated in FIG. 25, the memory cells MC of the state FogS1 to the state FogS15 in the page $PGn_P$ are each controlled to the state S1 to the state S15.

The fine write is executed similarly to the write sequence according to the first embodiment or the second embodiment.

Note that, in the semiconductor memory device according to the third embodiment, the foggy fine write is employed upon writing data. However, even in the write method other than the foggy fine write, it is also possible to employ a method that preliminarily adjusts the threshold voltage of the selected memory cell MC and the adjacent memory cell MC to some extent, and thereafter adjusts the threshold voltage of the selected memory cell MC.

Figure 26:
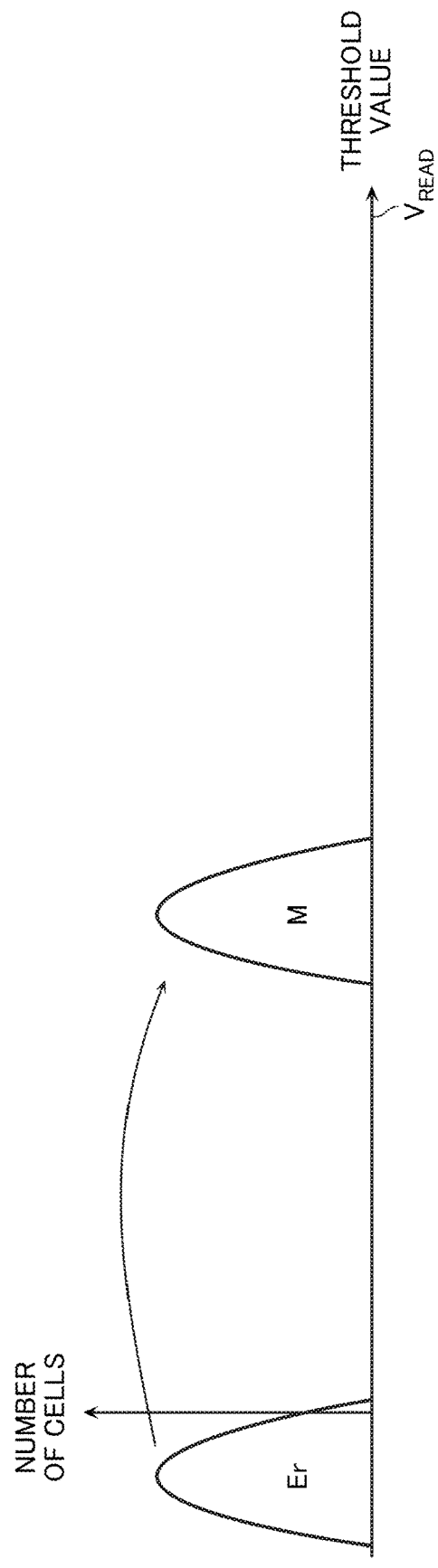
FIG. 26 is a schematic histogram for describing a write sequence according to another embodiment.
Figure 27:
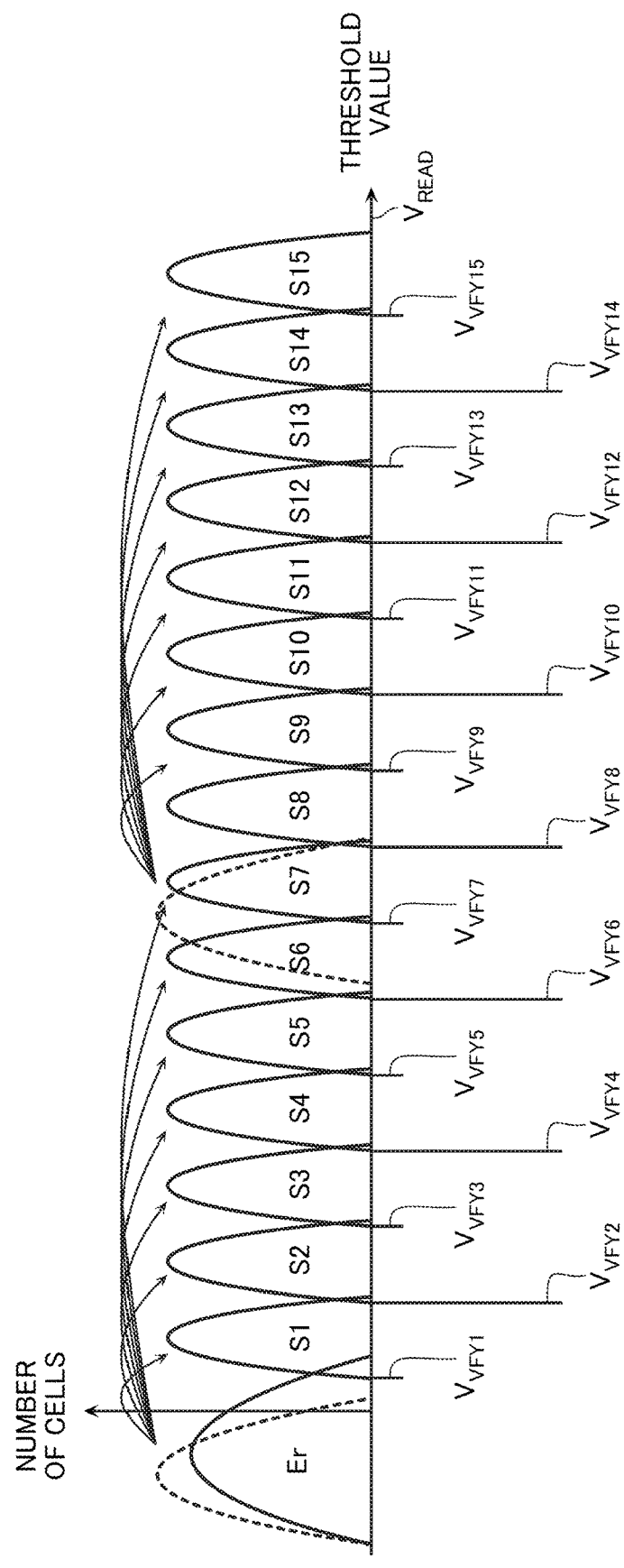
FIG. 27 is a schematic histogram for describing the write sequence according to the other embodiment.

For example, FIG. 26 and FIG. 27 illustrate an example where the method illustrated in the third embodiment is applied to a two stage write instead of the foggy fine write. In the two stage write, a 1st stage write and a 2nd stage write are executed.

The 1st stage write and the 2nd stage write are, for example, executed in an order similar to the order of the foggy write and the fine write illustrated in FIG. 23. For example, the 1st stage write is executed on the page $PGn_P$ as a 2n-th write sequence, and the 2nd stage write is executed on the page $PGn_P-1$ as a $2n_F+1$st write sequence.

As illustrated in FIG. 26, the 1st stage write is executed on the page PG in the erase state. In the 1st stage write, as illustrated in FIG. 26, a memory cell $MC_{S8}$ to a memory cell $MC_{S15}$ in the page PG are controlled to the threshold voltage corresponding to a state M by one write sequence.

The 1st stage write is basically executed by a method similar to the above-described foggy write. However, in the 1st stage write, only one pattern of the verify voltage is used in each of the write loops. This verify voltage is, for example, smaller than the verify voltage $V_{VFY8}$ corresponding to the state S8.

The 2nd stage write is executed similarly to the above-described fine write, for example, as illustrated in FIG. 27.

Another Embodiment

The semiconductor memory devices according to the first embodiment to the third embodiment have been described above. However, such configurations are merely examples, and specific configuration, method, and the like are appropriately adjustable.

For example, in the example in FIG. 18 and FIG. 21, the memory cell MC determined to be in the OFF state in the verify operation in the k-th write loop is treated as the inhibit memory cell MC in the write loop after k+2nd time or treated as the weak write memory cell MC in the k+2nd or k+3rd write loop. However, such a method is merely an example, and specific method and the like are appropriately adjustable. For example, these memory cells MC may be treated as the weak write memory cells MC in any of the write loops after k+4th time, instead of k+2nd time or k+3rd time. These memory cells MC may be treated as the weak write memory cells in two or more write loops.

For example, in the example in FIG. 18 and FIG. 21, the verify operation of the k+1st write loop is further executed on the memory cell MC determined to be in the OFF state in the verify operation of the k-th write loop, and the memory cells MC are classified into the plurality of kinds in accordance with the results of these two verify operations. However, such a method is merely an example, and specific method and the like are appropriately adjustable. For example, the verify operations of two or more write loops after k+1st time are executed on the memory cell MC determined to be in the OFF state in the verify operation of the k-th write loop, and the memory cells MC may be classified into the plurality of kinds in accordance with the results of these three or more times of verify operations.

In the semiconductor memory devices according to the first embodiment to the third embodiment, the lower end of the semiconductor layer 120 is connected to the semiconductor substrate 100. On the top surface of the semiconductor substrate 100, all the transistors included in the peripheral circuit PC are formed. However, such a configuration is merely an example. The methods, such as the write sequence, described above are applicable to a semiconductor memory device having another structure. The following exemplarily describes a structure of such a semiconductor memory device.

Figure 28:
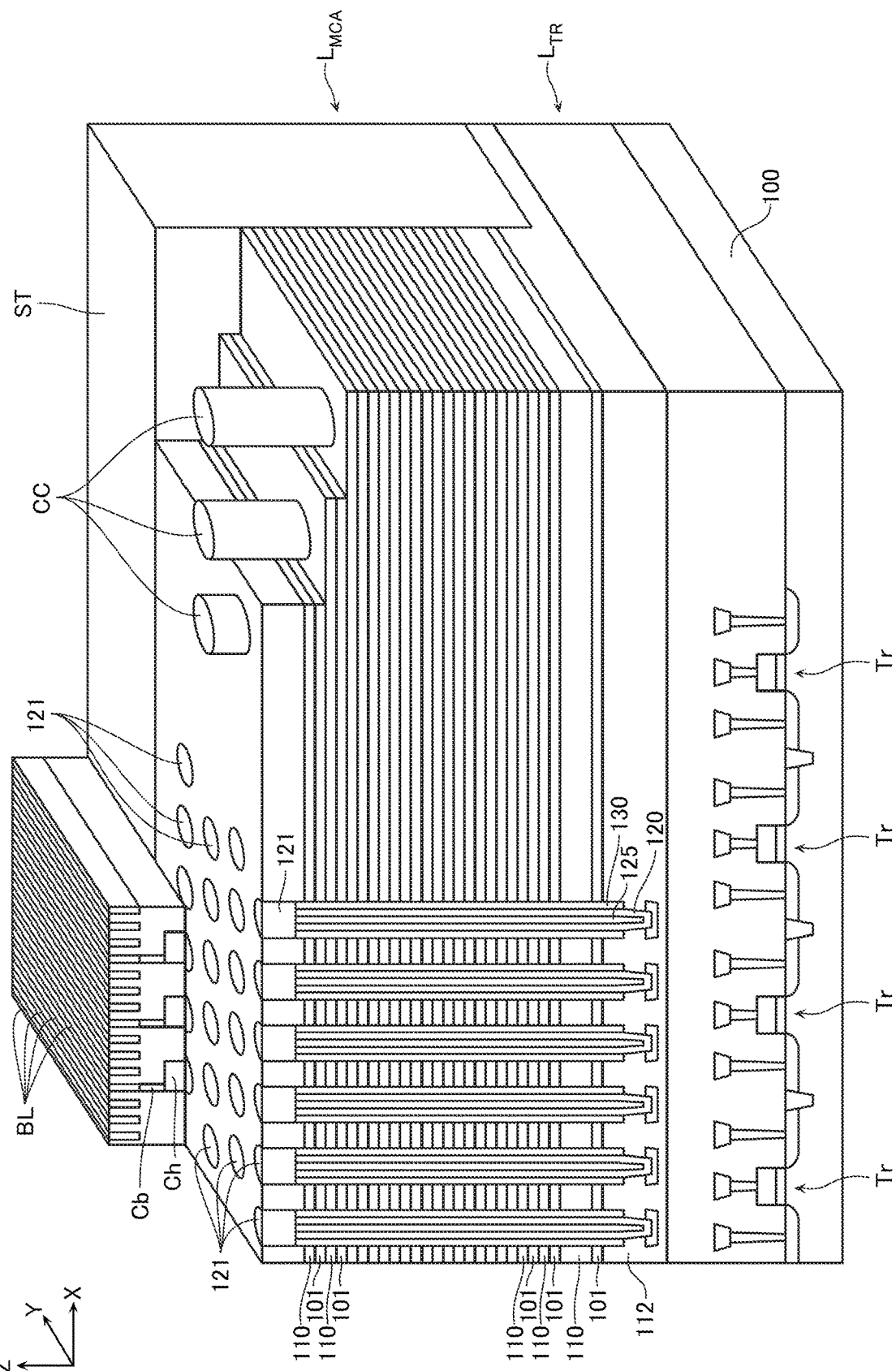
FIG. 28 is a schematic perspective view for describing a semiconductor memory device according to the other embodiment.

For example, a semiconductor memory device illustrated in FIG. 28 includes the semiconductor substrate 100, a transistor layer $L_{TR}$ disposed above the semiconductor substrate 100, and a memory cell array layer $L_{MCA}$ disposed above the transistor layer $L_{TR}$.

The transistor layer $L_{TR}$ includes a plurality of transistors Tr. The plurality of transistors Tr are field-effect type transistors with the top surface of the semiconductor substrate 100 as a channel region. In the illustrated configuration, the plurality of transistors Tr configure the peripheral circuit PC.

The memory cell array layer $L_{MCA}$ is basically configured similarly to the configuration on the semiconductor substrate 100 described with reference to FIG. 9 and the like. However, the memory cell array layer $L_{MCA}$ includes a conductive layer 112 disposed below the plurality of conductive layers 110. The semiconductor layer 120 has a lower end connected to the conductive layer 112 instead of the semiconductor substrate 100.

Such a configuration ensures arranging more transistors Tr in the transistor layer $L_{TR}$ compared with the semiconductor memory devices according to the first embodiment to the third embodiment. This, for example, ensures arranging more latch circuits DL0 to $DLn_L$ described with reference to FIG. 7. Therefore, the data indicative of the states of the memory cells MC described with reference to FIG. 15 and the like, the data indicative of the memory cells MC tem- porarily treated as the inhibit memory cells MC as described with reference to FIG. 18, and the like can be preferably held.

Figure 29:
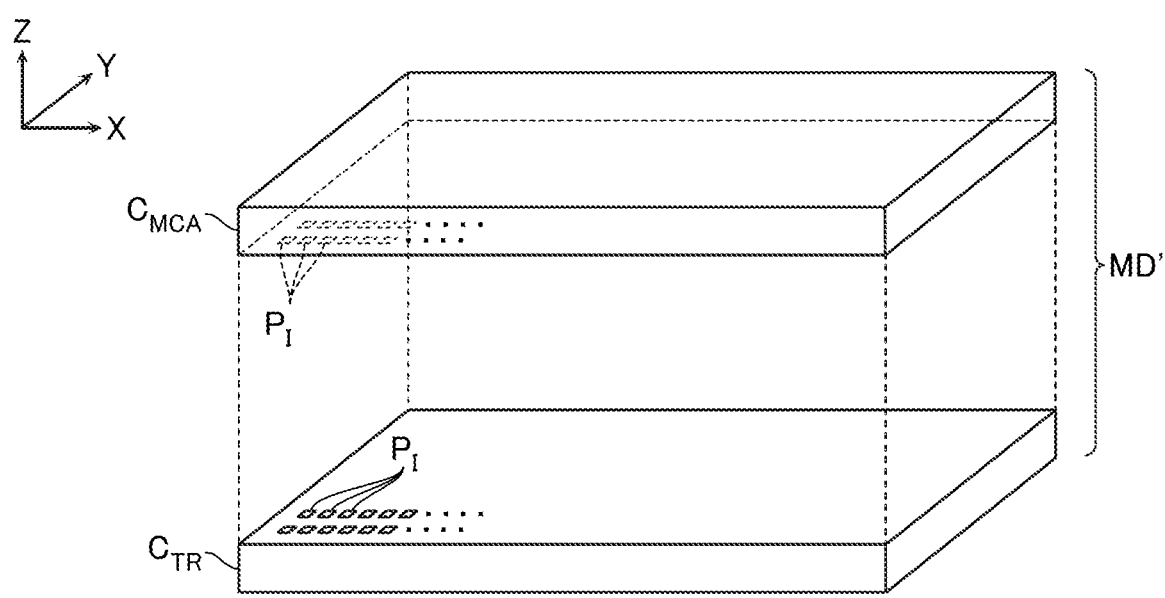
FIG. 29 is a schematic perspective view for describing the semiconductor memory device according to the other embodiment.

For example, a memory die MD' illustrated in FIG. 29 includes a chip $C_{MCA}$ and a chip $C_{TR}$. These chip $C_{MCA}$ and chip $C_{TR}$ include a plurality of bonding electrodes $P_I$ including copper (Cu) and the like, and are electrically and physically connected via the plurality of bonding electrodes $P_I$.

Figure 30:
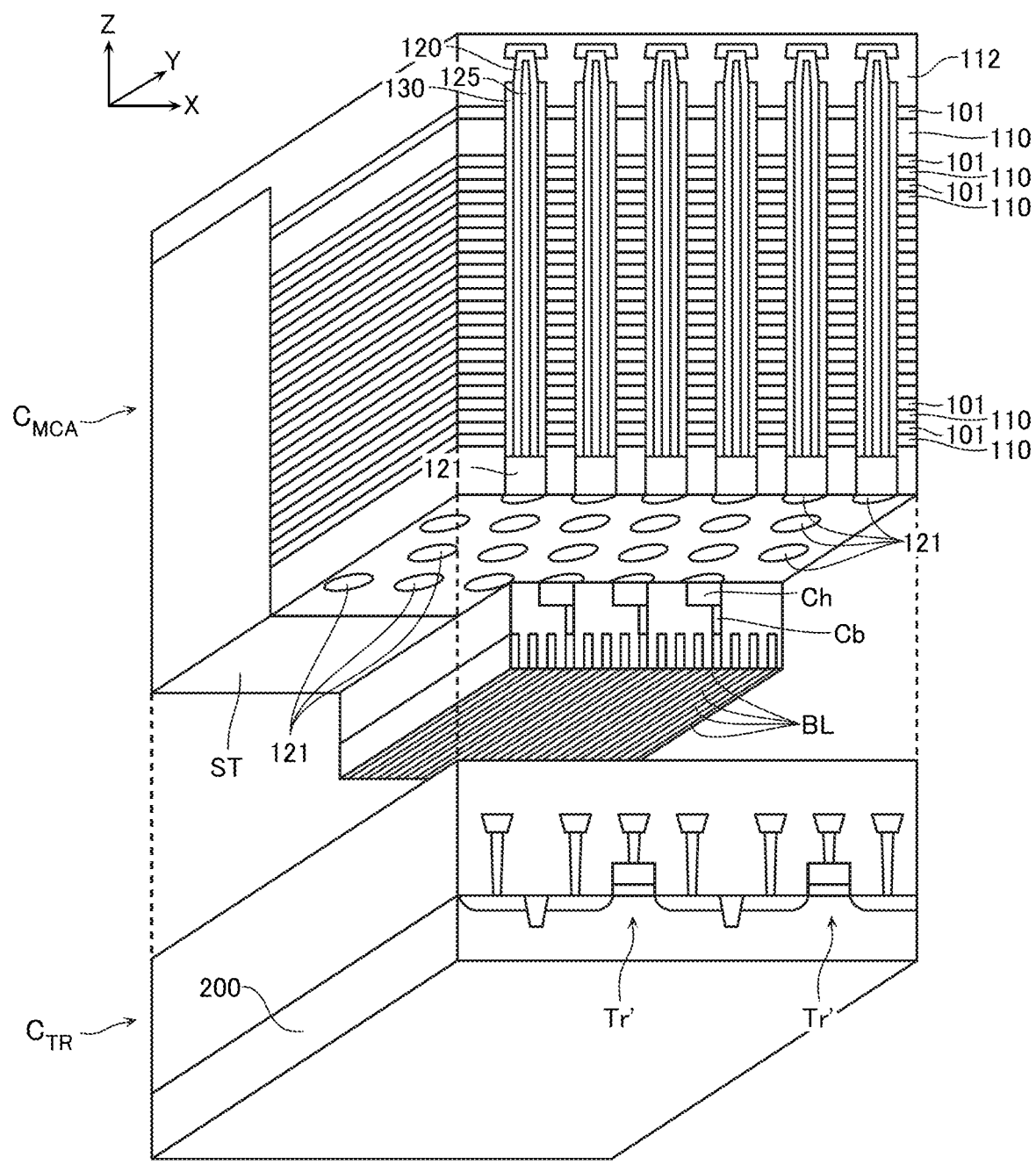
FIG. 30 is a schematic perspective view for describing the semiconductor memory device according to the other embodiment.

The chip $C_{MCA}$ may include the configuration on the semiconductor substrate 100 described with reference to FIG. 9, for example, as illustrated in FIG. 30, and may include the configuration in the memory cell array layer $L_{MCA}$ in FIG. 28. The chip $C_{MCA}$ need not include the transistor Tr and may include the transistor Tr. When the chip $C_{MCA}$ includes the transistor Tr, the chip $C_{MCA}$ may include the semiconductor substrate 100 and need not include the semiconductor substrate 100. When the chip $C_{MCA}$ includes the transistor Tr, the chip $C_{MCA}$ may include the transistor layer $L_{TR}$ and the memory cell array layer $L_{MCA}$ as described with reference to FIG. 28 as illustrated in FIG. 31.

The chip $C_{TR}$ includes a semiconductor substrate 200 and the plurality of transistors Tr'. The semiconductor substrate 200 may be, for example, configured approximately similarly to the semiconductor substrate 100. The plurality of transistors Tr' are field-effect type transistors with the top surface of the semiconductor substrate 200 as the channel region. In the example in FIG. 30 and FIG. 31, the plurality of transistors Tr, Tr' included in the chip $C_{MCA}$ and the chip $C_{TR}$ configure the peripheral circuit PC.

Such a configuration also ensures arranging more transistors Tr in the transistor layer $L_{TR}$ compared with the semiconductor memory devices according to the first embodiment to the third embodiment. Simultaneously, furthermore transistors Tr' can be arranged in the chip $C_{TR}$. This ensures, for example, arranging more latch circuits DL0 to $DLn_L$ described with reference to FIG. 7. Therefore, the data indicative of the states of the memory cells MC described with reference to FIG. 15 and the like, the data indicative of the memory cells MC temporarily treated as the inhibit memory cells MC as described with reference to FIG. 18, and the like can be preferably held.

Figure 31:
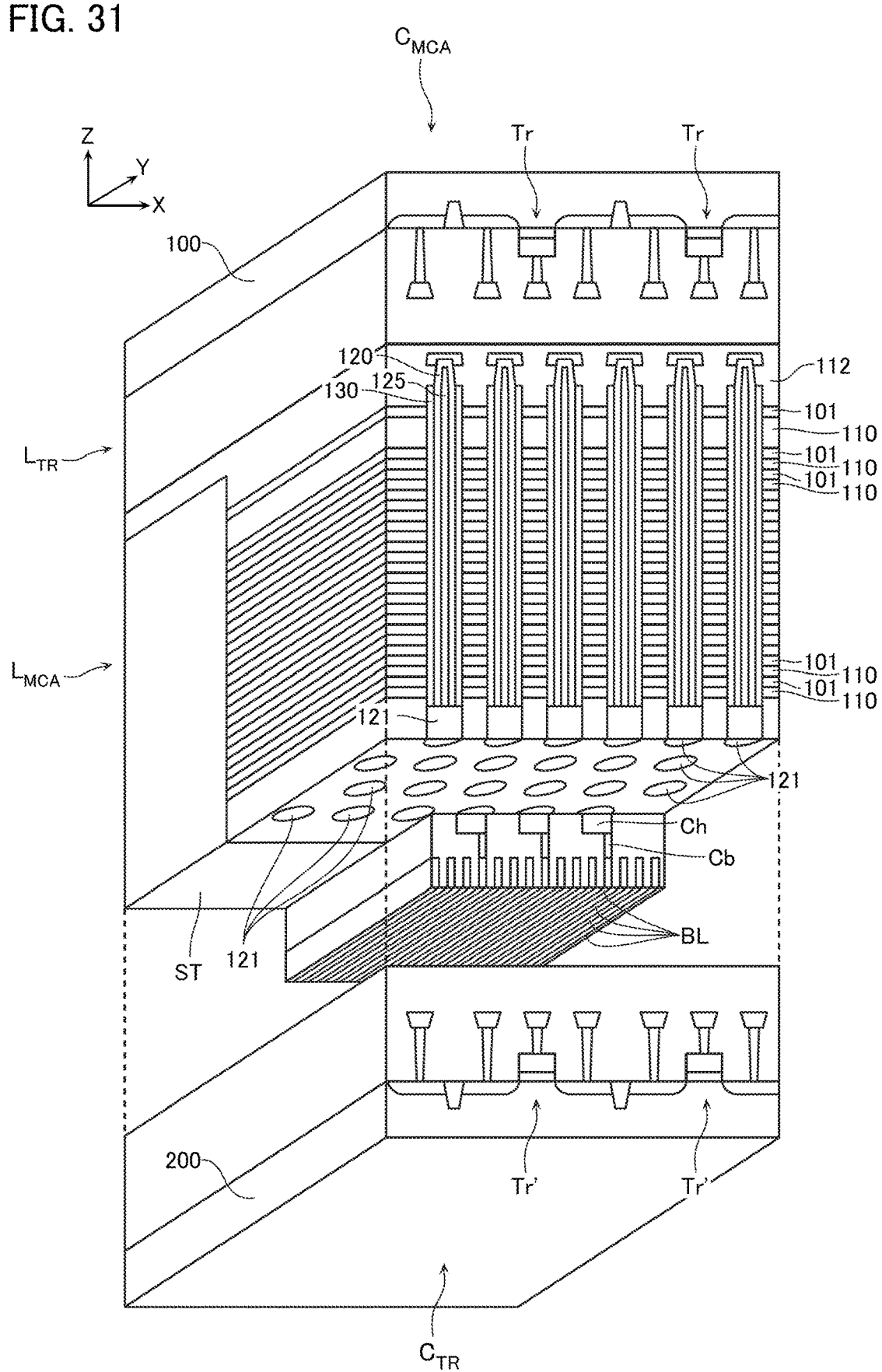
FIG. 31 is a schematic perspective view for describing the semiconductor memory device according to the other embodiment.

Note that, when the structure as illustrated in FIG. 31 is employed, for example, the configuration in the row decoder RD and the voltage generation circuit VG described with reference to FIG. 4 and the like may be achieved by the transistor Tr in the chip $C_{MCA}$. For example, the sense amplifier module SAM, the sequencer SQC, the cache memory CM, the address register ADR, the command register CMR, the status register STR, the input/output control circuit I/O, and the logic circuit CTR described with reference to FIG. 4 and the like may be achieved by the transistor Tr' in the chip $C_{TR}$.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory string including a first memory cell;
a second memory string including a second memory cell;
a first bit line connected to the first memory string;
a second bit line connected to the second memory string;
a first word line connected to the first memory cell and the second memory cell; and
a control circuit electrically connected to the first bit line, the second bit line, and the first word line, wherein
in a first write sequence on the first memory cell and the second memory cell, the control circuit:
supplies a first bit line voltage to the first bit line and the second bit line in a first program operation;
supplies a second bit line voltage larger than the first bit line voltage or a third bit line voltage larger than the second bit line voltage to the first bit line and the second bit line in a second program operation executed after the first program operation;
supplies the second bit line voltage to the first bit line and supplies the third bit line voltage to the second bit line in a third program operation executed after the second program operation; and
supplies the third bit line voltage to the first bit line and supplies the second bit line voltage to the second bit line in a fourth program operation executed after the third program operation.

2. The semiconductor memory device according to claim 1, further comprising:
a third memory string including a third memory cell; and
a third bit line connected to the third memory string, wherein
the first word line is connected to the third memory cell,
the control circuit is electrically connected to the third bit line, and
the control circuit:
supplies the first bit line voltage to the third bit line in the first program operation;
supplies the second bit line voltage or the third bit line voltage to the third bit line in the second program operation;
supplies the third bit line voltage to the third bit line in the third program operation; and
supplies the third bit line voltage to the third bit line in the fourth program operation.

3. The semiconductor memory device according to claim 1, further comprising
a first wiring electrically connected to the first word line, wherein
the control circuit:
supplies a first program voltage to the first wiring in the first program operation;
supplies a second program voltage larger than the first program voltage to the first wiring in the second program operation;
supplies a third program voltage larger than the second program voltage to the first wiring in the third program operation; and
supplies a fourth program voltage larger than the third program voltage to the first wiring in the fourth program operation.

4. The semiconductor memory device according to claim 3, wherein
the control circuit:
supplies a fourth bit line voltage larger than the second bit line voltage to the first bit line and the second bit line and supplies a verify voltage smaller than the first program voltage to the first wiring in a first verify operation executed after the first program operation and before the second program operation;
supplies the fourth bit line voltage to the first bit line and the second bit line and supplies the verify voltage to the first wiring in a second verify operation executed after the second program operation and before the third program operation; and
supplies the first bit line voltage to the first bit line and the second bit line and supplies the verify voltage to the first wiring in a third verify operation executed after the third program operation and before the fourth program operation.

5. The semiconductor memory device according to claim 4, further comprising:
a third memory string including a third memory cell; and
a third bit line connected to the third memory string, wherein
the first word line is connected to the third memory cell,
the control circuit is electrically connected to the third bit line, and
the control circuit:
supplies the fourth bit line voltage to the third bit line in the first verify operation;
supplies the fourth bit line voltage to the third bit line in the second verify operation; and
supplies the first bit line voltage to the third bit line in the third verify operation.

6. The semiconductor memory device according to claim 1, comprising:
a semiconductor substrate;
a memory cell array separated from the semiconductor substrate in a first direction intersecting with a surface of the semiconductor substrate, the memory cell array including the first memory string and the second memory string;
a third transistor disposed on the surface of the semiconductor substrate, the third transistor configuring a part of the control circuit; and
a second wiring disposed between the semiconductor substrate and the memory cell array, the second wiring being electrically connected to the third transistor.

7. The semiconductor memory device according to claim 1, comprising
a first chip and a second chip, wherein
the first chip includes:
the first memory string and the second memory string; and
a first bonding electrode, wherein
the second chip includes:
at least a part of the control circuit; and
a second bonding electrode connected to the first bonding electrode.

8. The semiconductor memory device according to claim 7, wherein
the first chip includes:
a semiconductor substrate;
a memory cell array separated from the semiconductor substrate in a first direction intersecting with a surface of the semiconductor substrate, the memory cell array including the first memory string and the second memory string;
a third transistor disposed on the surface of the semiconductor substrate, the third transistor configuring a part of the control circuit; and a second wiring disposed between the semiconductor substrate and the memory cell array, the second wiring being electrically connected to the third transistor.

9. A semiconductor memory device comprising:
a first memory string including a first memory cell;
a second memory string including a second memory cell;
a first bit line connected to the first memory string;
a second bit line connected to the second memory string;
a first word line connected to the first memory cell and the second memory cell;
a first voltage supply line electrically connected to the first bit line and the second bit line;
a second voltage supply line electrically connected to the first bit line and the second bit line;
a first voltage transfer circuit that electrically conducts the first bit line with the first voltage supply line in response to an input of a first signal and electrically conducts the first bit line with the second voltage supply line in response to an input of a second signal;
a second voltage transfer circuit that electrically conducts the second bit line with the first voltage supply line in response to an input of a third signal and electrically conducts the second bit line with second voltage supply line in response to an input of a fourth signal; and
a control circuit electrically connected to the first voltage supply line, the second voltage supply line, the first voltage transfer circuit, the second voltage transfer circuit, and the first word line, wherein
in a first write sequence on the first memory cell and the second memory cell, the control circuit:
in a first program operation,
supplies the first signal to the first voltage transfer circuit; and
supplies the third signal to the second voltage transfer circuit,
in a second program operation executed after the first program operation,
supplies the second signal to the first voltage transfer circuit; and
supplies the fourth signal to the second voltage transfer circuit,
in a third program operation executed after the second program operation, and
in a state where:
the control circuit supplies the first signal to the first voltage transfer circuit; and
the control circuit supplies the fourth signal to the second voltage transfer circuit,
the control circuit switches a signal supplied to the first voltage transfer circuit from the first signal to the second signal,
in a fourth program operation executed after the third program operation, and
in a state where:
the control circuit supplies the second signal to the first voltage transfer circuit; and
the control circuit supplies the third signal to the second voltage transfer circuit,
the control circuit switches a signal supplied to the second voltage transfer circuit from the third signal to the fourth signal.

10. The semiconductor memory device according to claim 9, wherein
in the second program operation and in a state where:
the control circuit supplies the first signal to the first voltage transfer circuit; and
the control circuit supplies the third signal to the second voltage transfer circuit,
the control circuit switches a signal supplied to the first voltage transfer circuit from the first signal to the second signal; and
the control circuit switches a signal supplied to the second voltage transfer circuit from the third signal to the fourth signal.

11. The semiconductor memory device according to claim 9, further comprising:
a third memory string including a third memory cell;
a third bit line connected to the third memory string; and
a third voltage transfer circuit that electrically conducts the third bit line with the first voltage supply line in response to an input of a fifth signal and electrically conducts the third bit line with the second voltage supply line in response to an input of a sixth signal, wherein
the first word line is electrically connected to the third memory cell, and
the control circuit:
in the first program operation,
supplies the fifth signal to the third voltage transfer circuit,
in the second program operation,
supplies the sixth signal to the third voltage transfer circuit,
in the third program operation,
supplies the sixth signal to the third voltage transfer circuit, and
in the fourth program operation,
supplies the sixth signal to the third voltage transfer circuit.

12. The semiconductor memory device according to claim 9, further comprising
a first wiring electrically connected to the first word line, wherein
the control circuit:
supplies a first program voltage to the first wiring in the first program operation;
supplies a second program voltage larger than the first program voltage to the first wiring in the second program operation;
supplies a third program voltage larger than the second program voltage to the first wiring in the third program operation; and
supplies a fourth program voltage larger than the third program voltage to the first wiring in the fourth program operation.

13. The semiconductor memory device according to claim 12, wherein
in a first verify operation executed after the first program operation and before the second program operation, the control circuit:
supplies the second signal to the first voltage transfer circuit;
supplies the fourth signal to the second voltage transfer circuit; and
supplies a verify voltage smaller than the first program voltage to the first wiring,
in a second verify operation executed after the second program operation and before the third program operation, the control circuit:
supplies the second signal to the first voltage transfer circuit;
supplies the fourth signal to the second voltage transfer circuit; and supplies the verify voltage to the first wiring, and in a third verify operation executed after the third program operation and before the fourth program operation, the control circuit:

supplies the first signal to the first voltage transfer circuit;

supplies the third signal to the second voltage transfer circuit; and supplies the verify voltage to the first wiring.

14. The semiconductor memory device according to claim 13, further comprising:

a third memory string including a third memory cell;

a third bit line connected to the third memory string; and a third voltage transfer circuit that electrically conducts the third bit line with the first voltage supply line in response to an input of a fifth signal and electrically conducts the third bit line with the second voltage supply line in response to an input of a sixth signal, wherein the first word line is electrically connected to the third memory cell, and the control circuit:

in the first verify operation, supplies the sixth signal to the third voltage transfer circuit, in the second verify operation, supplies the sixth signal to the third voltage transfer circuit, and in the third verify operation, supplies the fifth signal to the third voltage transfer circuit.

15. The semiconductor memory device according to claim 13, further comprising:

a first transistor including a first gate electrode connected to the first bit line;

a second transistor including a second gate electrode connected to the second bit line;

a first latch circuit electrically connected to the first transistor; and a second latch circuit electrically connected to the second transistor, wherein in the first verify operation or the second verify operation, only one of data latched by the first latch circuit or data latched by the second latch circuit is switched.

16. The semiconductor memory device according to claim 9, comprising:

a semiconductor substrate;

a memory cell array separated from the semiconductor substrate in a first direction intersecting with a surface of the semiconductor substrate, the memory cell array including the first memory string and the second memory string;

a third transistor disposed on the surface of the semiconductor substrate, the third transistor configuring a part of the control circuit; and a second wiring disposed between the semiconductor substrate and the memory cell array, the second wiring being electrically connected to the third transistor.

17. The semiconductor memory device according to claim 9, comprising a first chip and a second chip, wherein the first chip includes:

the first memory string and the second memory string; and a first bonding electrode, wherein the second chip includes:

at least a part of the control circuit; and a second bonding electrode connected to the first bonding electrode.

18. The semiconductor memory device according to claim 17, wherein the first chip includes:

a semiconductor substrate;

a memory cell array separated from the semiconductor substrate in a first direction intersecting with a surface of the semiconductor substrate, the memory cell array including the first memory string and the second memory string;

a third transistor disposed on the surface of the semiconductor substrate, the third transistor configuring a part of the control circuit; and a second wiring disposed between the semiconductor substrate and the memory cell array, the second wiring being electrically connected to the third transistor.

* * * * *